United States Patent
Alic et al.

(10) Patent No.: US 12,261,629 B2
(45) Date of Patent: Mar. 25, 2025

(54) BANDWIDTH CONSTRAINED COMMUNICATION SYSTEMS WITH NEURAL NETWORK BASED DETECTION

(71) Applicant: NTWINE, LLC, La Jolla, CA (US)

(72) Inventors: Nikola Alic, La Jolla, CA (US); Andreja Radosevic, Los Angeles, CA (US)

(73) Assignee: NTWINE, LLC, La Jolla, CA (US)

( * ) Notice: Subject to any disclaimer, the term of this patent is extended or adjusted under 35 U.S.C. 154(b) by 0 days.

(21) Appl. No.: 18/639,673

(22) Filed: Apr. 18, 2024

(65) Prior Publication Data

US 2024/0267061 A1 Aug. 8, 2024

Related U.S. Application Data

(63) Continuation of application No. 17/647,406, filed on Jan. 7, 2022, now Pat. No. 11,990,922.
(Continued)

(51) Int. Cl.
*H03M 13/00* (2006.01)
*G06N 3/04* (2023.01)
(Continued)

(52) U.S. Cl.
CPC .......... *H03M 13/6331* (2013.01); *G06N 3/04* (2013.01); *H03M 13/1197* (2013.01);
(Continued)

(58) Field of Classification Search
CPC ...... G06N 3/02; H03M 13/116; H03M 13/27; H04L 25/0202; H04L 25/03165;
(Continued)

(56) References Cited

U.S. PATENT DOCUMENTS 7,616,701 B2 11/2009 Ungerboeck
8,599,914 B1 12/2013 Eliaz
(Continued)

FOREIGN PATENT DOCUMENTS

| EP | 3454517 A1 | 5/2019 |
|---|---|---|
| JP | 2018196005 A | 12/2018 |
| WO | 2016093568 A1 | 6/2016 |

OTHER PUBLICATIONS

International Search Report and Written Opinion dated Jun. 24, 2021 for PCT Patent Application No. PCT/IB2021/051961.
(Continued)

*Primary Examiner* — David S Huang
(74) *Attorney, Agent, or Firm* — MLO, a professional corp.

(57) ABSTRACT

The technology relates to bandwidth constrained communication systems with neural network based detection. In some embodiments, a bandwidth constrained equalized transport (BCET) communication system comprises: a transmitter comprising an error control code encoder, a pulse-shaping filter, and a first interleaver; a communication channel; and a receiver comprising a neural network processing block that processes a received signal. The error control code encoder can append redundant information onto the signal. The pulse-shaping filter can intentionally introduce memory into the signal in the form of inter-symbol interference. The first interleaver can change a temporal order of the symbols in the signal. The neural network can be trained with positive mappings between transmitted and decoded training signals, or negative mappings between training signals and erroneous decoded signals that are known to contain errors.

12 Claims, 19 Drawing Sheets

Related U.S. Application Data

(60) Provisional application No. 63/199,591, filed on Jan. 11, 2021.

(51) Int. Cl.
| | |
|---|---|
| *H03M 13/11* | (2006.01) |
| *H03M 13/13* | (2006.01) |
| *H03M 13/27* | (2006.01) |
| *H03M 13/29* | (2006.01) |
| *H04L 25/03* | (2006.01) |
| *H04L 27/26* | (2006.01) |

(52) U.S. Cl.
CPC ............ *H03M 13/13* (2013.01); *H03M 13/27* (2013.01); *H03M 13/2957* (2013.01); *H04L 25/03203* (2013.01); *H04L 25/03834* (2013.01); *H04L 27/2628* (2013.01)

(58) Field of Classification Search
CPC ......... H04L 25/03203; H04L 25/03834; H04L 27/2628; H04L 27/2647
See application file for complete search history.

(56) References Cited

U.S. PATENT DOCUMENTS

| | | |
|---|---|---|
| 9,191,246 B2 | 11/2015 | Kanter |
| 10,715,276 B2 | 7/2020 | Radosevic et al. |
| 11,075,786 B1 | 7/2021 | Shattil |
| 11,240,083 B2 | 2/2022 | Radosevic et al. |
| 11,271,673 B2 | 3/2022 | Radosevic et al. |
| 11,570,023 B2 | 1/2023 | Nangare |
| 2004/0141548 A1 | 7/2004 | Shattil |
| 2007/0053449 A1 | 3/2007 | Adachi |
| 2007/0116143 A1 | 5/2007 | Bjerke et al. |
| 2007/0226599 A1 | 9/2007 | Motwani |
| 2008/0226301 A1 | 9/2008 | Alic et al. |
| 2009/0063926 A1 | 3/2009 | Cho et al. |
| 2009/0259915 A1 | 10/2009 | Livshitz et al. |
| 2010/0064195 A1 | 3/2010 | Dore et al. |
| 2010/0303160 A1 | 12/2010 | Rezvani et al. |
| 2011/0276860 A1 | 11/2011 | Lei et al. |
| 2012/0163489 A1 | 6/2012 | Ramakrishnan |
| 2013/0121307 A1 | 5/2013 | Murakami et al. |
| 2013/0336377 A1 | 12/2013 | Liu et al. |
| 2014/0269885 A1 | 9/2014 | Alic |
| 2014/0269894 A1 | 9/2014 | Alic et al. |
| 2015/0156041 A1 | 6/2015 | Eliaz |
| 2015/0318955 A1 | 11/2015 | Wu et al. |
| 2015/0333942 A1 | 11/2015 | Land et al. |
| 2016/0112238 A1 | 4/2016 | Ling et al. |
| 2016/0164626 A1 | 6/2016 | Cavaliere et al. |
| 2016/0218752 A1 | 7/2016 | Liu |
| 2016/0233979 A1 | 8/2016 | Koike-Akino |
| 2016/0315637 A1 | 10/2016 | Cai |
| 2016/0352419 A1 | 12/2016 | Fonseka et al. |
| 2017/0033894 A1 | 2/2017 | Ahn et al. |
| 2017/0099173 A1 | 4/2017 | Yun et al. |
| 2017/0272283 A1 | 9/2017 | Kingery et al. |
| 2018/0115323 A1 | 4/2018 | Marchand et al. |
| 2018/0262274 A1 | 9/2018 | Yu et al. |
| 2019/0363825 A1 | 11/2019 | Radosevic et al. |
| 2021/0143840 A1 | 5/2021 | Luo |

OTHER PUBLICATIONS

International Search Report dated Sep. 10, 2019 for PCT Patent Application No. PCT/US19/33524.

Matsumoto, T., et al., "Adaptive Transmission With Single-Carrier Multilevel BICM", Proceedings of the IEEE, vol. 95,, Issue: 12, IEEE, Dec. 2007, pp. 2354-2367. (Year: 2007).

Notice of Allowance and Fees dated Jan. 23, 2024 for U.S. Appl. No. 17/647,406.

Notice of Allowance and Fees dated Sep. 27, 2021 for U.S. Appl. No. 17/249,670.

Notice of Allowance dated Mar. 16, 2020 for U.S. Appl. No. 16/418,798.

Office Action dated Mar. 24, 2023 for U.S. Appl. No. 17/647,406.

Office Action dated Sep. 28, 2023 for U.S. Appl. No. 17/647,406.

FIG. 8

BANDWIDTH CONSTRAINED COMMUNICATION SYSTEMS WITH NEURAL NETWORK BASED DETECTION

RELATED APPLICATIONS

The application is a continuation of U.S. patent application Ser. No. 17/647,406 filed on Jan. 7, 2022, which claims the benefit of U.S. Provisional Patent Application No. 63/199,591 filed on Jan. 11, 2021, and entitled "Bandwidth Constrained Communication Systems with Neural Network Based Detection"; which is hereby incorporated by reference for all purposes.

BACKGROUND

Communication systems strive to reliably transmit a high quantity of information over a channel of a given bandwidth. In traditional design of communication systems, predominantly modulation formats without memory are used. These systems cannot approach the theoretical bounds of spectral efficiency, also known as the Shannon limit or Shannon capacity without the aid of error control coding (ECC). Coupled with sophisticated encoding schemes that jointly optimize the modulation and error control coding, communication systems without memory can perform close to the theoretical bounds. Error-control codes typically append redundant information bits, or symbols, so as to achieve resilience and/or improved performance in the presence of obstacles in the process of the information transfer, such as noise and distortions.

Improved performance can be achieved with so-called iterative decoding at the receiver, in which the reliability estimates on the received information symbols are exchanged between the constituent codes' decoders multiple times, with an improved estimate on the information symbols being obtained with each additional iteration.

The process of iterative decoding encompasses interleaving and deinterleaving processes. In these processes, the passing of the codewords between multiple constituent decoders can include the permutation of the relevant information symbols corresponding to the pertinent constituent codes.

Additionally, in some communications systems such as wireless communication systems, channel impairments cause performance degradation. For example fading due to multipath propagation is ever present in wireless communications and can degrade a transmitted signal. Multipath propagation can even cause frequency selective fading when the coherence bandwidth of the transmission channel in the system is smaller than the bandwidth of the transmitted signal. Some systems seek to mitigate these impairments by signal processing, modulation schemes and error control coding. As an example of signal processing and modulation schemes, orthogonal frequency-division multiplexing (OFDM) and code division multiple access (CDMA) employ frequency diversity to mitigate fading distortions, provide resiliency to multipath fading, or simplify the mitigation of multipath fading.

Machine learning is the study of computer algorithms that improve through experience, either autonomously, or by an aid from an outside human, or machine agent. Machine learning algorithms construct models based on sample data (i.e., training data) in order to make predictions or decisions without being explicitly programmed to do so. Machine learning algorithms can be used in various applications, such as email filtering and computer vision. Neural network (i.e., artificial neural network) (NN) algorithms are a category of machine learning algorithms. Computing systems with neural networks can "learn" to perform tasks by considering examples, generally without being programmed with any task-specific rules. Deep learning algorithms can be neural network algorithms and can be useful for processing large datasets of labelled analog data, such as image, text, audio, and video.

SUMMARY

The present disclosure provides techniques for bandwidth constrained communication systems with neural network based detection. In some embodiments, a bandwidth constrained equalized transport (BCET) communication system, comprises a transmitter that transmits a signal comprising symbols, a communication channel that transports the signal and a receiver that receives the signal. The transmitter can comprise an error control code encoder, a pulse-shaping filter, and a first interleaver. The receiver can comprise a neural network processing block that processes the received signal. The error control code encoder can append redundant information onto the signal. The pulse-shaping filter can intentionally introduce memory into the signal in the form of inter-symbol interference. The first interleaver can change a temporal order of the symbols in the signal. The BCET communication system can be bandwidth constrained. The signal can comprise an information rate that is higher than that of a communication system without intentional introduction of the memory at the transmitter.

In some embodiments, a method comprises: providing an input signal comprising symbols; encoding the symbols using an error control code encoder in a transmitter of a communication system to produce encoded symbols; interleaving the encoded symbols using a first interleaver in the transmitter to produce interleaved symbols; intentionally introducing memory into the interleaved symbols in the form of inter-symbol interference using a pulse-shaping filter in the transmitter to produce pulse-shaped symbols; transmitting the pulse-shaped symbols to a receiver of the communication system over a physical channel with noise; receiving the transmitted pulse-shaped symbols using a receiving filter in the receiver to produce a received filtered signal; and processing the received filtered signal using a neural network to detect and retrieve the encoded symbols. The error control code encoder can append redundant information onto the symbols and can be a low-density parity-check (LDPC) error control code encoder. The neural network can be trained with positive mappings between training signals output from a training transmission channel of a training communication system and decoded training signals as well as negative mappings between the training signals output from the training transmission channel and a null space of an LDPC generation matrix.

In some embodiments, the techniques described herein relate to a method including: providing an input signal including symbols; encoding the symbols using an error control code encoder in a transmitter of a communication system to produce encoded symbols, wherein the error control code encoder appends redundant information onto the symbols; interleaving the encoded symbols using a first interleaver in the transmitter to produce interleaved symbols; intentionally introducing memory into the interleaved symbols in the form of inter-symbol interference using a pulse-shaping filter in the transmitter to produce pulse-shaped symbols; transmitting the pulse-shaped symbols to a receiver of the communication system over a physical channel with noise; receiving the transmitted pulse-shaped symbols using a receiving filter in the receiver to produce a received filtered signal; and processing the received filtered signal using a neural network to detect and retrieve the encoded symbols; wherein the neural network is trained with positive mappings between training signals output from a training transmission channel of a training communication system and decoded training signals as well as negative mappings between the training signals output from the training transmission channel and erroneous decoded signals that are known to contain errors.

BRIEF DESCRIPTION OF THE DRAWINGS

FIG. 8 is an example of a parity check matrix, in accordance with some embodiments.

DETAILED DESCRIPTION

Figure 1:
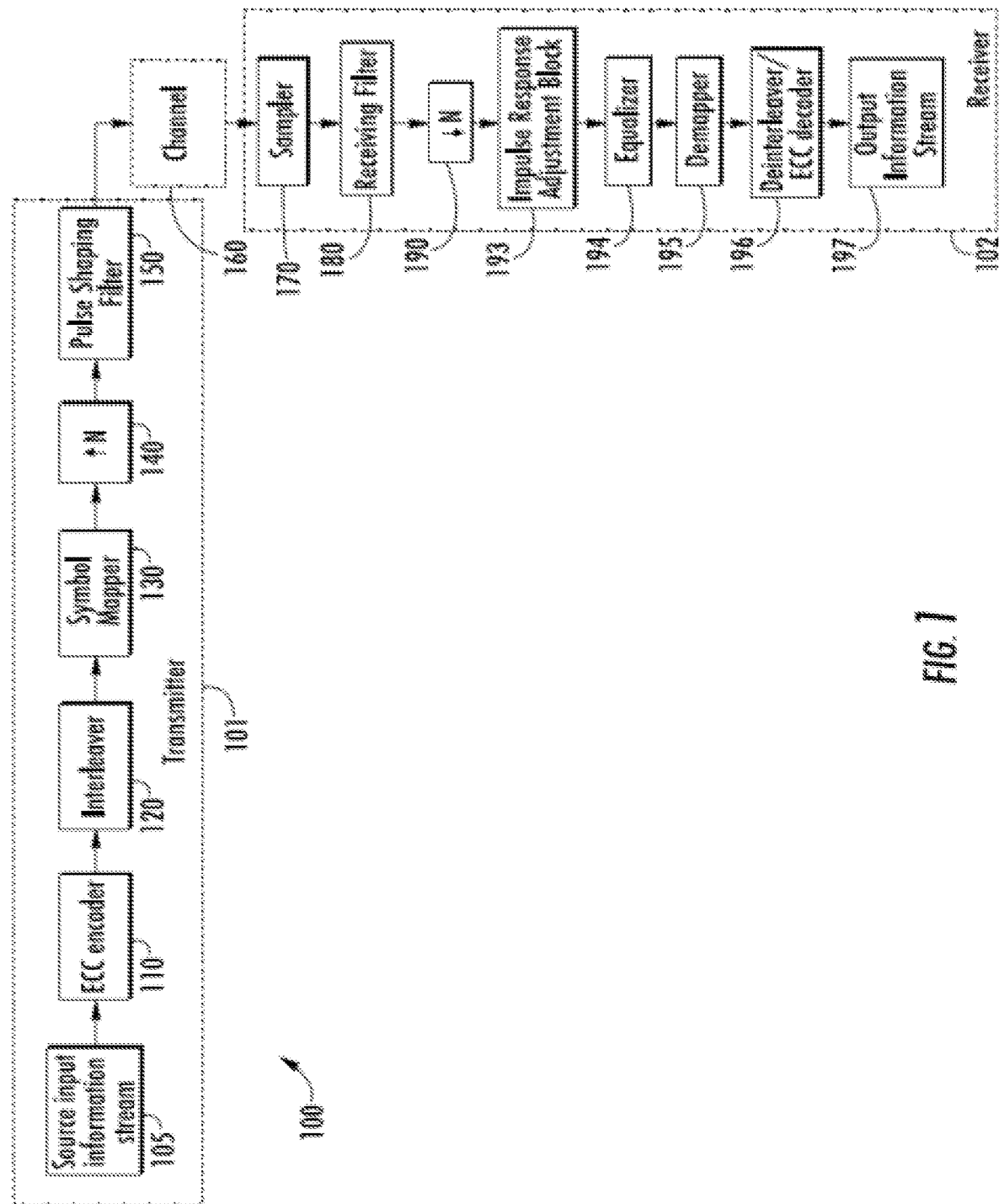
FIG. 1 shows a block diagram of an example of a bandwidth constrained equalized transport (BCET) communication system, in accordance with some embodiments.

The present invention includes systems and methods directed at improving the performance of bandwidth constrained systems and/or the capacity of communication systems by equalization, or signal processing. In some cases, the described systems and methods can rely on using time domain processing and/or multicarrier (or multidimensional) frequency domain information processing with the aim of reducing the associated processing, or circuit implementation complexity. In some embodiments, the described systems and methods simplify the transmitter and/or receiver structure in bandwidth constrained systems. In some cases, the transmitter and/or the receiver uses frequency domain processing, which simplifies the system compared to those performing multidimensional information processing in the time domain. In some cases, the receiver includes one or more neural network (i.e., artificial neural network) (NN) processing blocks (or other type of machine learning or deep learning processing blocks), which in some cases can simplify the receiver structure compared to systems that do not utilize NN processing. In some embodiments, NN or machine learning algorithms are utilized so as to operate on the data of a signal (either analog or digital) obtained from communication systems (e.g., wireless, wireline, optical or satellite), and specifically the BCET systems. In some embodiments, the described communication systems and methods are referred to as bandwidth constrained equalized transport (BCET) systems and methods. The term "BCET communication system" (or "BCET system") as used herein is defined as a communication system that uses narrowband filtering in the transmitter to intentionally introduce memory into a signal, and equalization techniques in the receiver to account for the intentionally introduced memory. If properly designed, the achievable information rate in BCET systems can be improved over conventional communication systems that do not intentionally introduce memory in the signal.

BCET systems typically rely on equalization to mitigate the effect of bandwidth limitation. In particular, the systems with high spectral efficiency, or equivalently a considerable amount of bandwidth limitation, can be affected by distortions that induce a significant extension of the channel response duration, thus requiring long, and/or complex equalization structures to appropriately handle the effects of the induced intersymbol interference. Complex equalizers required to implement the sophisticated encoding schemes not only significantly increase the complexity and the practical realization of their systems, but also increase the overall system power consumption.

The overall performance and the underlying complexity of the equalizer used in communication systems represent critical concerns in their practical realizations, and are of particular importance for wideband systems with high throughput. These properties result in both higher reliability and/or capacity in communication systems, as well as a lower receiver and system overall power dissipation and an easier practical implementation.

When transmitting a bandwidth constrained signal over a frequency selective channel in a BCET system, both the BCET signaling channel and multipath frequency selective channel can induce inter-symbol interference (ISI) in the received signals. The signal processing complexity (e.g., the number of arithmetic operations per data symbol) in time domain equalization increases at least linearly with the number of data symbol intervals spanned by the lengths of the BCET pulse-shaping filter and frequency selective channel impulse response. In contrast, frequency domain processing (e.g., using a discrete Fourier transform (DFT)) of information in the transmitter and receiver sides of a BCET communication system can enable the use of lower complexity system components per data symbol. Therefore, frequency domain information (or signal) processing has advantages compared to time domain processing to cope with the channel frequency selectivity in practical applications of BCET technologies. For example, BCET systems utilizing multidimensional frequency domain information processing are useful for next-generation broadband wireless and satellite systems (e.g., with bit rates of tens or hundreds of megabits per second).

Single carrier modulation (SCM), in which data symbols are transmitted in serial fashion, has been the traditional digital communications format since the early days of telegraphy. An alternative is multicarrier transmission, where multiple data streams, each modulating a narrowband waveform, or tone, are transmitted in parallel, thus allowing each tone to be separately equalized by a simple gain and phase factor. Multicarrier transmission has become popular and widely used within the last two decades, mainly due to its excellent complexity/performance tradeoff for data symbol rates far above coherence bandwidths. Generation and block processing of multicarrier signals in the frequency domain are enormously simplified by implementing the DFTs by fast Fourier transforms (FFTs), enabling a reduced signal processing complexity (e.g., one that grows only logarithmically) with the channel impulse response length in the presence of multipath fading impairment.

In multicarrier systems, frequency domain processing techniques can also be used to facilitate and simplify equalization of SCM or single carrier orthogonal-frequency division multiplex (SC-OFDM) systems. As an alternative to OFDM systems, traditional SCM or SC-OFDM systems can utilize frequency domain processing implementations with simplicity/performance tradeoffs similar to that of OFDM for highly frequency selective channels. In such cases, the only difference is the inverse DFT is moved from the transmitter to the receiver. SCM or SC-OFDM waveforms have the additional advantage that for a given signal power their range of amplitude, measured by the peak-to-average ratio, is significantly less than that of multicarrier signals. As a result, the transmitted spectra and performance of SCM or SC-OFDM waveforms are less affected by transmitter power amplifier nonlinearities. This allows cheaper and more efficient high-power amplifiers to be used for transmitting SCM or SC-OFDM signals. A further benefit of SCM or SC-OFDM signals is their greater robustness to frequency offset and phase noise than that of OFDM signals.

Orthogonal frequency-division multiplexing (OFDM) is a type of digital modulation that can be adopted to many communication standards, mainly due to its potential for superior complexity-performance tradeoff for data symbol rates far beyond coherence bandwidth of the transmission medium (i.e., physical channel). In contrast, traditional time-domain modulation schemes typically require a high-complexity equalizer at the receiver in order to cope with excessive frequency selectivity of the channel.

OFDM signal generation at the transmitter and demodulation processing at the receiver are typically based on Fast Fourier Transform (FFT) operations that enormously simplify hardware implementation, yielding a signal processing complexity that grows only logarithmically with the channel impulse response (CIR) length. In specific, an information bit stream at the transmitter is typically converted into multiple independent (low-rate) data streams, each modulating a narrowband waveform (called a sub-carrier) utilizing an inverse FFT operation, and transmitted in parallel. At the receiver, each tone is typically separately equalized with a simple gain and phase factor and demodulated utilizing an FFT operation. This rather simple one-tap frequency domain processing provides a lower complexity per data symbol than for traditional time-domain modulations, which makes them attractive solutions for communication systems utilizing BCET technology that inherently deals with ever challenging channel equalization.

SCM or SC-OFDM systems and methods are not necessarily potential replacements of OFDM systems and methods, but rather are complementary to them. Traditional SCM or SC-OFDM systems can be modified to a special form of multicarrier transmission systems called DFT-precoded OFDM (or single-carrier frequency domain modulation, or SC-FDM) systems. As such, these systems are a form of generalized multicarrier transmission (GMC).

The GMC approach establishes a unified description for various multicarrier as well as single-carrier techniques. Using the GMC principle, means for pilot design and channel estimation can also be unified. This applies to frequency domain pilots which are embedded in the GMC signal, as well as pilot sequences time multiplexed with data-bearing GMC blocks that can be incorporated into BCET systems.

In some cases, highly dispersive frequency-selective gigabit signals can be transmitted using a BCET system with frequency domain information processing. In such cases, a channel impulse response (CIR) can spread over dozens or hundreds of short-duration BCET symbols, and the complexity of time equalization structures may become prohibitive with such severe ISI.

Frequency-domain equalization (FDE) techniques that were originally developed for SCM or SC-OFDM systems can be applied to a BCET receiver to resolve inherent, severe ISI imposed by the BCET signal generation. Owing to the explicit benefit of efficient Fast Fourier Transform (FFT) based reception, such an FDE receiver could allow the receiver to handle CIR spreading over thousands of symbols, while maintaining a realistic equalization complexity at the receiver (e.g., with practical hardware and cost requirements). One possible FDE scheme is to use a diagonal minimum-mean square error (MMSE) equalizer in the frequency domain (e.g., similar to those used in uncoded, hard decision-based transmission systems). Unfortunately, such an FDE-aided BCET receiver would fail to approach the optimal maximum likelihood (ML) performance in severe ISI scenarios.

In some cases, the hard-decision FDE used in the receiver of a BCET system could be extended to a soft-decision (SoD) FDE, which can enable practical iterative detection in a channel encoded BCET arrangement. A BCET architecture with such a powerful SoD FDE channel coding scheme can be capable of achieving near capacity performance, while maintaining a lower complexity, which is a benefit of FDE.

In order to achieve near capacity performance in the BCET systems with frequency domain processing described herein, powerful channel codes, such as turbo and low-density parity-check (LDPC) codes can be employed. LDPC rates, check node profile codes, and variable node profile codes can be optimized in the transmitter using standard procedures, EXIT chart, or density evolution, in order to match FDE ISI detector characteristics.

Similar to those in time domain equalization (TDE) BCET systems, FDE-based receivers can also take into account BCET-specific colored noise effects, to improve the performance of the system. In hard-decision FDE-based receivers that consider the effects of colored noise in uncoded systems, the MMSE weights are designed to whiten (or, decorrelate) the matched filter specific colored noise, where the weight matrix is approximated to be diagonal in order to maintain low-complexity operation. However, since practical BCET systems employ a powerful channel coding scheme, such as turbo equalization in order to eliminate BCET-specific ISI, the systems and methods described herein consider iterative BCET receivers assisted by soft-decision MMSE detectors, where MMSE weighting can also be used to whiten colored noise.

Channel state information (CSI) can be made available at the receiver by periodically transmitting pilot symbols to estimate different channel coefficients.

In BCET system transmitters, pilot symbols may be inserted into signals in the frequency domain, referred to as frequency-multiplexed pilot (i.e., frequency-division multiplexed pilots, FDP) schemes, or can be inserted in the time domain, referred to as time-multiplexed pilot (i.e., time-division multiplexed pilots, TDP) schemes. One advantage of frequency-multiplexed pilots is that, since they are embedded in data blocks, they do not require any extra cyclic prefix (CP) overhead. However, multiplexing pilot tones into the signal bandwidth can affect the peak to average power ratio (PAPR) of a single carrier (SC) signal. Different techniques of pilot tone insertion can be used in BCET systems. In some cases, data carrying tones can be scaled for superimposing of the pilot tones, which is called frequency domain superimposed pilot technique (FDSPT). An advantage of FDSPT is that the signal bandwidth does not need to be expanded, and therefore the spectral efficiency is maintained. However, FDSPT can suffer from performance degradation in channel estimation (CE) due to losing portions of the useful data frequencies and/or inducing slightly higher peak to average power ratio (PAPR) than when no pilots are present. In other cases, BCET pilot tone insertion can be done by shifting groups of data frequencies for multiplexing of the pilot tones, which is called frequency expanding technique (FET). A signal with pilots inserted using FET can have a slightly lower spectral efficiency than that of a conventional SC signal without pilots, due to the expansion of data frequencies to accommodate the pilot tones.

BCET systems and methods using different types of signal processing will now be described, and subsequently BCET systems and methods utilizing frequency domain processing for multicarrier (or multidimensional) signals will be described.

In some cases, BCET systems can utilize NNs, or other machine learning or deep learning systems and methods. For example, NN processing can be used in the receiver to simplify the detection circuitry for a BCET system.

An NN can approximate, or capture any (arbitrary) input/output relationship (e.g., from the universal approximation theorem), and thus a simplified receiver for information retrieval of BCET modulated data (especially in a low SNR scenario) can be realized by an appropriate NN architecture. For example, the BCET systems and methods described herein can use a recursive NN, a recurrent NN (RNN), a long short-term memory RNN, a gated recurrent unit NN, an Elman NN, and/or a Jordan NN.

In some cases, the NN can simplify the structure of the BCET system by performing one or more steps that would otherwise be performed by processing blocks in non-NN BCET systems (i.e., BCET systems that do not use NNs or other types of machine learning or deep learning), such as coding blocks, iterative information processing blocks, and turbo-loop processing blocks. An advantage of using NN processing in BCET systems instead of non-NN processing (e.g., with turbo-loops), is lower complexity and latency.

For example, the turbo-equalization loops for BCET hardware implementations described herein can be modeled as a sequence of serially connected equalizer-decoder pairs, where the sequence length corresponds to the number of turbo iterations. The turbo-loop model can be replaced by an NN that performs the same function, in some cases, with lower complexity and latency. For example, the NN can have a stage depth that is proportional to the number of turbo iterations, and a certain number of NN stages can be used to represent a single equalizer-decoder pair.

In some embodiments, a procedure for implementing an NN in a BCET system includes the steps of 1) training a conceived (e.g., general and arbitrarily complex) NN, and 2) upon satisfactory convergence, rely on the NN to detect and retrieve the data at the receiver (e.g., where the NN replaces the detection procedure and the turbo loop described herein for non-NN BCET systems). In some cases, the NN complexity in stages can be optimized and pruned, to achieve a less complex structure (e.g., of finite and ultimately minimum complexity). Training NNs for BCET systems is discussed further below.

Furthermore, in some cases, a combination of non-NN and NN processing in a BCET receiver can also be used. For example, the NN can take over after a single equalization run (instead of entering the turbo-equalization loop), or the NN processing can run after one whole turbo-loop iteration, or the NN processing can take over after a certain number of turbo-loop iterations. In some cases, the use of an NN processing block and a turbo-loop in a BCET system reduces the number of iterations through the turbo-loop required to achieve the same performance compared the system without the NN processing block.

NN-based receiver implementations with varying design architectures are applicable for both time and frequency domain BCET receivers. Additionally, the NN can replace (and/or perform the function of) either one of the principal components of the BCET decoding system, i.e., the equalizer (e.g., a BCJR equalizer), or the decoder (e.g., an LDPC decoder), or both.

NN-based receivers can also be of use for general communication systems (e.g., BCET systems) that do not rely on turbo-loops but do rely on some sort of the iterative process for information retrieval, such as the decoding of LDPC codes alone.

In some embodiments, a BCET system includes a receiver comprising an equalizer, an optional pre-processing approach applied to the incoming waveforms (i.e., samples) availing the utilization of a lower complexity information retrieving equalizer, and an error control decoder matched to the encoder in the transmitter and to the bandwidth constrained channel. Advantageously, BCET systems can obtain superior system performance, with lower system complexity, latency and power dissipation. In some cases, BCET systems employ digital reshaping at the receiver in a specific way, so as to avail utilization of lower complexity information retrieving equalizers in the receiver processing chain.

In some embodiments, a method for receiving data in a BCET communications system includes the following steps: (1) shortening the channel response by means of a specific signal processing step; (2) equalization, or information retrieval by an appropriate equalizer, and (3) error control decoding. The equalizers in the receiver can be implemented in the time domain or the frequency domain.

In some embodiments, a method for complexity reduction of equalizers in communication systems, consists of the following steps: (1) acquiring a full length channel response, i.e., for symbol patterns equal in length (or longer) to the length of the channel spread, (2) reducing the set of channel responses by averaging (e.g., weighted averaging) the subsets of responses chosen in a particular way (e.g., the channel responses are divided into subgroups, based on the underlying symbol patterns they correspond to), and (3) using the thus obtained reduced set of responses as a model channel response for lower complexity equalization. In some cases, steps (1) and (2) in the method above can be repeated periodically (e.g., in the case of time varying channels).

Systems and methods relating to BCET systems are described more completely in U.S. patent application Ser. No. 16/418,798, U.S. Pat. Nos. 10,020,912, and 9,154,346, the entirety of which are incorporated herein by reference.

The present BCET systems and methods employ optimized error control coding in conjunction with bandwidth constriction (i.e., intentionally introducing memory into the communication system) to attain a novel quality (e.g., in performance and capacity) in communication systems. In some embodiments, a system architecture is applied at the receiver of a bandwidth constrained communication system (or in a BCET communication system with intentionally introduced memory) to attain a novel quality (e.g., in performance and capacity). In some embodiments, the systems and methods described herein can operate even closer to the theoretical bounds than conventional systems (e.g., those mentioned above). For example, the systems and methods described herein can operate close to, or above, the Shannon limit for memoryless channels with additive white Gaussian noise.

The present communication systems provide superior system performance, latency and power dissipation compared to conventional systems, with complexity levels suitable for practical implementations. In different embodiments, the described systems include non-orthogonal pulse shape transmission, receivers comprising equalizers, optionally a pre-processing method applied to the incoming waveforms with the goal of using a lower complexity information retrieving equalizer, and/or error control coders and decoders matched to the bandwidth constrained channels of the systems.

A method for use with bandwidth restricted communication systems includes an appropriate combination of partial response channel design, equalization, and error control coding, and qualitatively improves the overall system performance and capacity. A "partial response channel" usually denotes a channel where the channel output at some time instant is a weighted sum (or other function) of a finite number of previous channel inputs, rather than just the amplified channel input value at the same time instant (plus some noise value). In contrast, a "full response channel" is a channel with no ISI. For example, in BCET systems partial response channels are intentionally created by using specially designed pulse-shape filters that are non-orthogonal to the sample rate. However, partial response channels are traditionally considered as unwanted phenomenon in communication transmission, which appear as a consequence of some implementation imprecision or multipath propagation effects. In some embodiments, a partial response channel in a bandwidth restricted communication system transmits a bandwidth limited signal (e.g., signals that have been shaped using particular types of pulse-shaping filters, such as root-cosine and root-raised-cosine filters). In some embodiments, in addition to the intentional pulse shaping performed on the bandwidth constrained signal, partial response channels can also unintentionally distort signals during transmission through the channel. In some embodiments, the described systems and methods include digital reshaping at the receiver in a specific way (e.g., to whiten colored noise samples after matched filtering, and to shorten the channel response), which enables the use of lower complexity information retrieving equalizers in the receiver processing chain. In some embodiments, the described systems and methods include the following steps: (1) implementation of a non-orthogonal partial response channel design; (2) shortening of the channel response by means of a specific signal processing step; (3) equalization (or information retrieval by an appropriate equalizer); and (4) error control decoding.

The present BCET systems and methods are different from conventional systems and methods. Some examples of differences, in some embodiments, include that the described systems and methods: (1) encompass a particular combination of processing steps (e.g., specific pulse shape design, optimized error control coding in bandwidth constricted systems, and intersymbol interference shortening and trellis-based equalization) that provide qualitatively novel and improved system performance; (2) enable a significant complexity reduction of the information retrieving equalizer by introducing a pre-processing step of signal reshaping; (3) enable additional gains by employing nonlinear processing elements on internal receiver signal paths: (4) provide additional gains closer to theoretical capacities (e.g., close to or exceeding the Shannon limit for memoryless channels with additive white Gaussian noise) by optimizing error control code structures according to introduced narrowband response parameters. The present systems employ bandwidth constriction to improve the information rate by advantageously intentionally introducing memory (or ISI) through unconventional pulse shaping in the transmitter. This is in contrast to conventional systems, which may be affected by unintentional memory (or ISI), which is minimized, and viewed as a problem or disadvantage.

The present invention is applicable to a wide range of transmission technologies and/or communication protocols. For example, it can be used for binary and/or M-ary information streams, a variety of error-correction schemes, as well as in M-ary single carrier or Orthogonal-Frequency Division Multiplex (OFDM) modulation modes.

Furthermore, the present invention is not restricted to a certain equalization techniques. For example, pulse-shaping filters can be employed with the optimal full complexity BCJR equalizer (i.e., a Bahl-Cocke-Jelinek-Raviv equalizer, named after the inventors), BCJR equalizers with reduced complexity (e.g., M-BCJR, T-BCJR), or Viterbi-based equalizers. The described systems and methods are also applicable to a BCET system with an arbitrary bandwidth narrowing factor and/or equalizer complexity level.

In some embodiments, the receivers of the systems described herein contain a detector, a filter, an equalizer and a decoder with an interleaver (and optionally, a de-mapper). Similar components can be found in conventional receivers. However, the systems described herein are bandwidth constrained systems with intentionally introduced memory, and therefore conventional components and methods are insufficient. For example, the equalizers in the current systems (e.g., BCJR equalizers) are much more complex than conventional equalizers employed to deal with unintentional partial response channels. Such complex equalizers are not used in conventional receivers, due to the inherent exponential complexity with memory. For another example, the current data extraction systems and methods can contain turbo-equalization-loops (i.e., multiple circular exchanges of information between the equalizer and the decoder, which are described more completely below), which, in addition to adding complexity, also adds significant latency. The advantage of the current systems and methods over conventional systems and methods is that exceptional performance can be achieved with lower complexity than has been previously described.

Additionally, in some embodiments, methods for designing optimized structured irregular low-density parity-check (LDPC) codes can be utilized. These codes can be applied as error correction methods within trellis-based equalization in turbo loops in BCET systems.

In some embodiments, the above method enables construction of optimized LDPC codes that fulfil one or more of the following requirements: 1) the code belongs to the irregular repeat accumulator (IRA) class of codes, that enables linear complexity of the encoding; 2) the parity check matrix can be rearranged in quasi-cyclic (QC) form, that enables layered decoding without hardware memory (i.e., information storage within electronic hardware such as field programmable gate array/application-specific integrated circuit (FPGA/ASIC), and not memory effects applied to a signal such as intersymbol interference) conflicts; 3) the degree distributions and the parameters of the turbo loop are optimized for the known (i.e., designed) partial response channel and required level of parallelism; and 4) the designed code compensates for the imprecision caused by reducing the complexity of the equalization part of a turbo loop.

In some embodiments, the present invention combines different optimization techniques in a unique fashion, to produce optimized LDPC codes that are adjusted to BCET pulse-shaping and receiving filters in BCET systems. These optimized LDPC codes can enable reliable communication rates in BCET systems that operate close to or even potentially exceed the Shannon limit.

FIG. 1 illustrates an example of a bandwidth constrained equalized transport (BCET) system 100 comprised of a transmitter 101, a receiver 102 and a communication channel 160. The transmitter 101 incorporates the following blocks: source information input stream 105 error-correction code (ECC) encoder 110, interleaver 120, symbol mapper 130, up-sampler 140 and pulse-shaping filter 150. The pulse-shaping filter 150 narrows the signal waveform bandwidth. The receiving side of the transmission chain (i.e., the receiver 102) contains the following elements: sampler 170, receiving filter 180, down-sampler 190, impulse response adjustment block 193, information-retrieving equalizer (i.e., equalizer or equalization block) 194, de-mapper 195, and deinterleaver/ECC decoder 196, and produces the output information stream 197.

In some embodiments, the information is encoded with error-control redundant symbols using an ECC encoder (e.g., 110 in FIG. 1) with a Low-Density Parity-Check (LDPC) code, a turbo code, a polar code, or other type of error control code. Although different types of error-control codes can have different strengths and weaknesses, the systems and methods described herein are not limited to a particular type of code. For instance, LDPC codes can enable superior system capacity while using attractive implementation architectures (e.g., with layered LDPC decoders), compared to turbo codes. LDPC code optimization is discussed in more detail in U.S. patent application Ser. No. 16/418,798. Polar codes also can enable high system capacity, but can have higher complexity for practical implementations (e.g., using a successive cancellation decoder), compared to systems based on LDPC codes. In another example, polar codes can be used in ECC encoders in BCET systems by replacing the block polarization kernel that is used in the polar code construction for channels without memory by a kernel appropriate for channels with memory and possibly a convoluted kernel. In adoption of polar codes for BCET systems, the successive cancellation list decoding algorithm can be used, that is a sub-optimal version of the successive cancellation decoding algorithm, which in turn enables higher information throughputs of the overall system as well as a lower receiver complexity. In some embodiments, the ECC encoder includes a cascade of two component encoders (e.g., an outer and an inner encoder). Throughout this disclosure, the present systems and methods are sometimes described within the context of LDPC codes, however, the examples above illustrate that the systems and methods described herein are applicable to applications using many different types of codes (e.g., turbo codes or polar codes).

In some embodiments, interleaver 120 can take the sequence of symbols from its input and produce the identical symbols at the output, but in a different temporal order. In some embodiments, interleaver 120 is used to disperse sequences in bit streams (or in streams of symbols) so as to minimize the effects of burst errors, or correlated channel impairments such as ISI.

In some embodiments, the pulse-shaping filter 150 narrows the bandwidth required for the transmission by spreading the value of a single modulated symbol to L neighboring symbols, i.e., producing ISI and thus intentionally introducing memory into the transmitted signals. In other words, L is the symbol memory length in the BCET system. The systems and methods described herein intentionally distort the signal (i.e., by narrowband filtering) and contain an ECC optimized for the distorted signal, which unexpectedly improve system performance (e.g., increases the spectral efficiency of the system, improves the dispersion of the system, and/or increases the system capacity). The systems described herein are therefore different than traditional communication systems, which have unintentional distortions that degrade system performance. System capacity, as used herein, refers to the information rate per bandwidth of frequency that is achieved at a given signal-to-noise ratio (SNR). Systems and methods wherein memory is intentionally introduced into transmitted signals in communications systems with increased spectral efficiency and/or dispersion are described more completely in U.S. Pat. No. 8,155,530, the entirety of which is incorporated herein by reference.

In some embodiments, the pulse-shaping is the result of a specific design optimization procedure. In some embodiments, the pulse-shaping filter 150 is compatible with one or more of the following design requirements: 1) a high achievable information rate; 2) overall narrowband response (NBR) energy clustering; 3) spectral power concentration (or power in/out of band (PIB/POB) criterion); 4) compliance with the existing spectral masks for wireless transmission; 5) appropriate peak-to-average-power-ratio (PAPR); and 6) appropriate complexity of the information-retrieving equalizer on the receiver side of the system.

Figure 2:
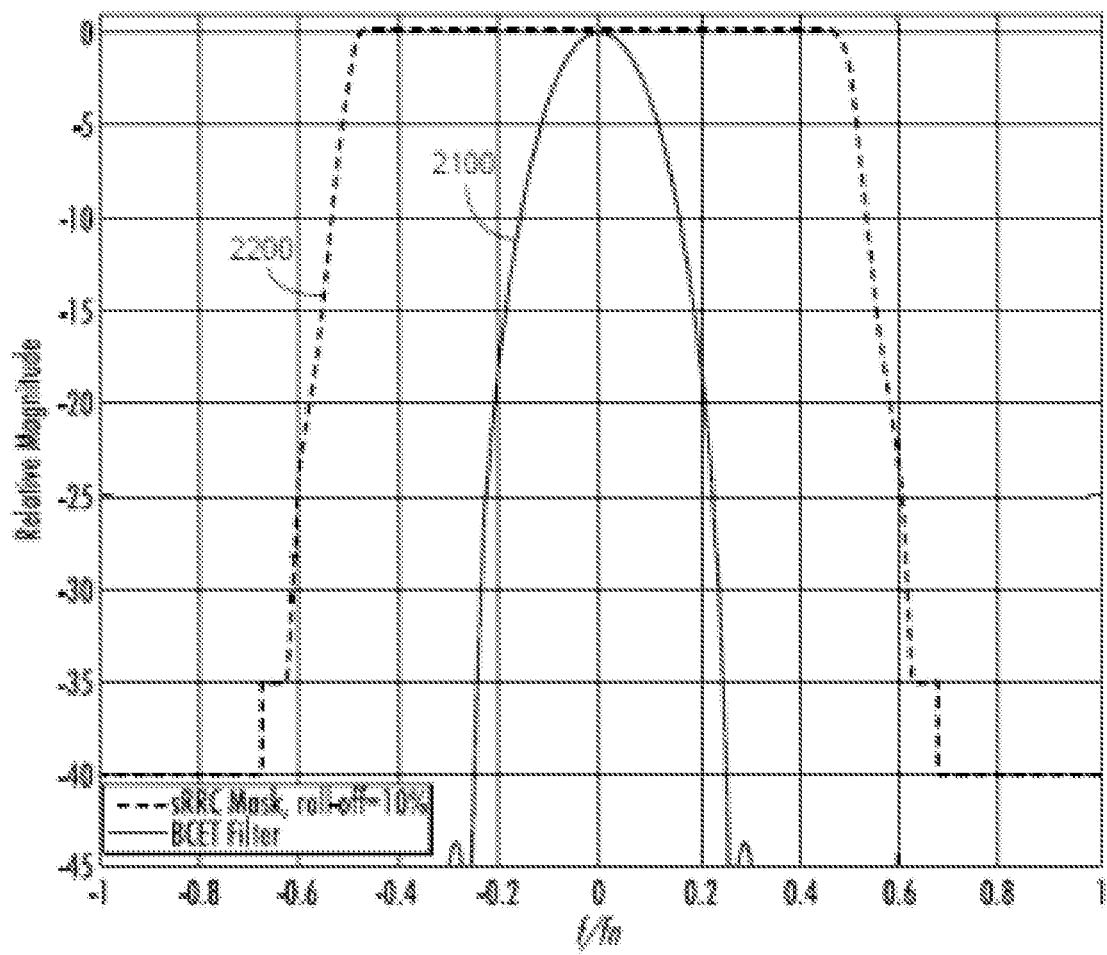
FIG. 2 shows an example of a frequency response of a pulse-shaping filter, with 300% bandwidth reduction compared to Nyquist signaling, in accordance with some embodiments.

In some embodiments, a parameter to consider in pulse shape optimization is the complexity of the information retrieving equalizer. More symbol memory intentionally induced in the system 100 (i.e., increasing L), corresponds to an exponential increase in hardware complexity of the equalizer. In some embodiments, the present pulse-shaping filters (e.g., 150) have the required PIB (Power in Band) performance criterion, for example 99% or 99.9% of the power inside a specified constrained bandwidth, and also induce low memory that is acceptable for practical implementations of the system. An example of an optimal pulse shape that fulfills these criteria are Prolate Spheroidal Wave Functions (PSWF). In some cases, those pulse shapes have optimal time-bandwidth properties. FIG. 2 is an illustrative example of a PSWF filter response in the spectral domain. The graph in FIG. 2 represents the power spectrum of the filter 2100, where the x-axis is the normalized frequency and the y-axis is the magnitude of the response of the filter. In this example, the filter introduces a factor of 3 of spectral compression compared to the square-root raised cosine (SRRC) power spectrum 2200, which is denoted as NBR3 in Table 1 and discussed further below. In other embodiments, the pulse-shaping filter introduces a factor of 2 or more, 3 or more, 4 or more, 5 or more, or a factor from 3 to 10, of spectral compression compared to the square-root raised cosine (SRRC) power spectrum. Additionally, considering time-bandwidth optimality, another example of possible pulse shapes are Gaussian pulse shapes, which have slightly larger time-bandwidth product for the specified PIB criterion. In other embodiments, the pulse-shaping filter utilizes a prolate spheroid wave function, a Gaussian wave function, or digital or discrete representations of thereof. The pulse-shaping filter can utilize any wave function shape that introduces a factor of 2 or more, 3 or more, 4 or more, 5 or more, or a factor from 3 to 10, of spectral compression compared to the square-root raised cosine (SRRC) power spectrum.

In some embodiments, a pulse-shaping filter narrows the bandwidth to a specified value, and maximizes the spectral efficiency and achievable information rates, and has PAPR that is not significantly larger than the PAPR of an orthogonal Nyquist linear modulated signal with higher order modulations with the same spectral efficiency (for a specified PIB criterion, a required hardware complexity, and a maximal memory (i.e., maximum L) induced in the system 100).

Figure 3:
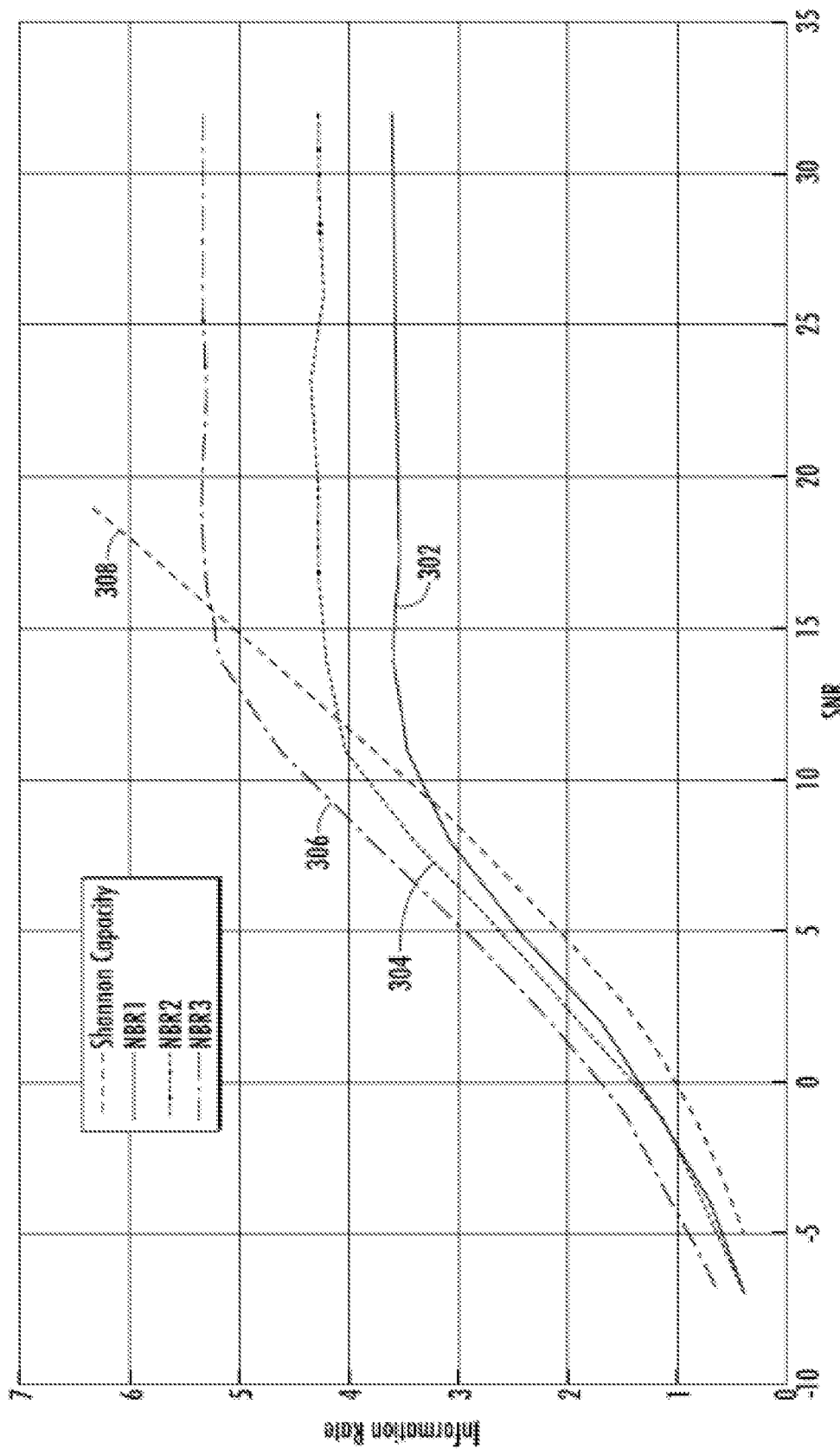
FIG. 3 shows examples of achievable information rates for signals in a BCET communication system using three different optimized pulse-shaping filters, in accordance with some embodiments.

FIG. 3 illustrates an example of achievable information rates for three NBRs, designed with PSWF pulse shapes, combined with Quadrature Phase Shift Keying (QPSK) modulation, denoted by NBR1 (302), NBR2 (304) and NBR3 (306). In these examples, the LDPC codes are optimized to the different NBRs (i.e., NBR1, NBR2 and NBR3). The plot in FIG. 3 shows the achievable information rate versus SNR for NBR1 (302), NBR2 (304) and NBR3 (306), and for the Shannon limit 308. The PIB criterion is 99% for the NBRs in this example. The NBRs in this example also satisfy the following constraints: 1) bandwidth reduction compared to spectrum required for the SRRC pulse shaping is 220%, 260% and 300%, for NBR1, NBR2 and NBR3, respectively; and 2) PAPRs for all of the NBRs are comparable to the PAPR of the system with an SRRC filter, Nyquist signalling, and high order modulation achieving the similar information rate as BCET systems. The parameters of the NBRs in this example are summarized in TABLE 1.

TABLE 1

Narrowband Response Parameters

| Narrow band response | NBR length after shortening | Modulation scheme | Maximal spectral efficiency | Peak-to-average-power ratio of T1 |
|---|---|---|---|---|
| NBR1 | 3 | QPSK | 3.55 b/s/Hz | 5.2 dB |
| NBR2 | 4 | QPSK | 4.27 b/s/Hz | 6.1 dB |
| NBR3 | 5 | QPSK | 5.33 b/s/Hz | 6.9 dB |

Returning to FIG. 1, after re-shaping the received signal by the matched receiving filter 180, and down-sampling it by the down-sampler 190, symbols can be optionally additionally processed by the impulse response adjustment block 193, which is an additional processing step prior to the information retrieving equalizer. In some embodiments, the matched filter at the receiver side is a narrow-band filter that is complementary to the pulse-shaping filter 150 in the transmitter. For example, the function used in filter in block 180 can be a conjugated time-reversed version of the function used in filter in block 150, implemented in the frequency domain.

In some embodiments, the equalization block 194 works directly on symbols obtained by matched filtering, wherein the filter transfer characteristic is matched to the characteristic of the pulse-shaping filter 150. In some cases, the symbol observations contain samples of the noise that are correlated (e.g., those generated using the so-called Ungerboeck observation model). In such cases, an equalizer algorithm is used that can accommodate the colored noise.

In some embodiments, optional impulse response adjustment block 193 is used to whiten the colored noise samples after matched filtering, and shorten the channel response, enabling the utilization of a less complex information-retrieving equalizer. In some embodiments, impulse response adjustment block 193 contains a noise whitening filter which is designed to partially or fully decorrelate the noise samples and/or cluster the majority of the energy of the equivalent partial response to only a small number of samples L'<L.

In some embodiments, the impulse response adjustment block 193 can be realized as a finite impulse response filter, which additionally shortens the impulse response (i.e., effectively reduces L), however other similar approaches achieving the same effect can be applied. Channel shortening is advantageous because it can shorten the effective impulse response, which enables lower complexity equalizer design. In some cases, it is not necessary to adapt the equalizer algorithm to work with the colored noise samples (e.g., using the so-called Forney observation model).

Continuing with FIG. 1, intentionally added ISI, by the pulse-shaping filter 150, as well as interference potentially produced by the channel 160, can be treated (e.g., removed or mitigated) in the equalization block 194.

In some embodiments, the BCET equalization is a two-step process: in the first step interference introduced by the communication channel is removed or mitigated, for which any conventional equalizer can be used (e.g., Feed-Forward and/or Decision-Feedback Equalizers), while in the second step a sophisticated equalization technique (e.g., utilizing a BCJR equalizer) is employed to extract transmitted symbols from the intentionally introduced ISI. The equalization process can be optionally joined with the de-mapper 195, interleaver and deinterleaver/ECC decoder 196 blocks in an iterative loop, i.e., a turbo equalization loop, as described further herein.

In some embodiments, the equalizer in a BCET system contains the BCJR algorithm. Equalizers using the BCJR algorithm are optimal for BCET systems (considering MAP (maximum a posteriori probability) criteria). BCJR is a sequential algorithm with a trellis structure where the number of states in each stage of the trellis is $M^L$, where M is the size of the modulation alphabet (e.g., M=2 for BPSK, M=4 for QPSK, M=8 for 8PSK, etc.), and L is the span of ISI memory. The algorithm processes a received (input) data sequence (e.g., an LDPC codeword) on a symbol-by-symbol basis starting from the beginning of the sequence. In some embodiments, the equalizer contains a sub-optimal BCJR variant of the algorithm, such as M-BCJR, T-BCJR, or similar families of algorithms (e.g., Viterbi algorithm, or soft output Viterbi algorithm (SOVA)).

Both the optimal BCJR and sub-optimal algorithms described above typically process data serially. The sequential nature of the algorithms used in BCET system can pose a significant constraint on the achievable throughput of the system using such equalizers.

In order to improve this imposed throughput constraint, in some embodiments, the equalizer in a BCET system contains a plurality of modules in a parallel arrangement, where each module contains a BCJR algorithm utilizing windows or partitions. In some cases, the trellis length N (i.e., the length of the received sequence) of the algorithm can be partitioned into K smaller trellises that are processed in parallel (e.g., one in each module), thereby increasing the system throughput K-fold. In such cases, the length of each trellis partition is N/K. In some embodiments, N/K is greater than 100, or is greater than 200, or is greater than 500, or is from 100 to 1000, and the sub-optimal solution with parallel processing exhibits negligible performance degradation when compared to the optimal full-length trellis without parallel processing. In some embodiments, the receiver is implemented following the Forney channel model, and the partitions are completely independent (i.e., there is no overlap between the neighboring trellises). In other embodiments, the receiver is implemented following the Ungerboeck channel model, and the neighboring partitions overlap. In some embodiments, this overlap is about 10 symbols, or about 20 symbols, or about 50 symbols, or from 10 to 100 symbols. For example, when the neighboring partitions have lengths of 200 and overlap by 20 symbols, the overall system throughput increase is about (1−20/200)*K=0.9*K compared to the optimal BCJR (i.e., a 10% lower overall boost in throughput when compared to Forney channel model which achieves K-fold increase in throughput). In some embodiments, K is greater than 10, or greater than 100, or greater than 200, or greater than 300, or greater than 500, or is from 10 to 1000, or is from 50 to 500. In addition to the type of model used, the value of K that is possible depends on the partition size, and the LDPC codeword length. For example, given a partition size of 200 for the Forney model (or, 220 for the Ungerboeck model including the overhead), and an LDPC codeword size of 16200 or 64800, the value of K achieved can be 80 or 320, respectively. One tradeoff of boosting the overall system throughput by parallelizing the BCJR-based equalization, is that the system is required to have K times more hardware memory (e.g., on a FPGA/ASIC) to process all of the partitions in parallel. When windowed/partitioned BCJR is used in a turbo equalization loop, only in the first iteration of the turbo loop is equal likelihood assigned to each state at the initialization stage for each window/partition. After the first iteration of the turbo loop, likelihoods at the decoder output are assigned to each state at the initialization stage for each window/partition.

In some embodiments, the equalizer contains a BCJR variant algorithm, with reduced complexity compared to the full complexity optimal BCJR algorithm.

In some embodiments, the equalizer contains an I and Q (i.e., in-phase and quadrature) BCJR algorithm (e.g., in systems processing QPSK modulated signals). As described above, the BCJR complexity is $M^L$, which is a polynomial in the modulation alphabet M. If the modulation alphabet is higher than binary (e.g., higher than that using binary phase shift keying, or BPSK), the complexity can be reduced by introducing a sub-optimal solution which processes different parts of the alphabet separately. For example, the I and Q branches of the modulation alphabet (e.g., in QPSK schemes) can be processed separately. In that case, the overall complexity of the solution is $2*M^L/2^L$ which dramatically simplifies the equalizer architecture, and hardware memory consumption on FPGA/ASIC. In some embodiments, replacing a single QPSK-based BCJR with 2 BPSK-based BCJRs (one for the I-branch another for the Q-branch) running in parallel, results in a negligible loss in the system performance (e.g., a negligible increase in bit error rate (BER)).

In some embodiments, channel shortening can be applied in the receiver processing chain prior to the equalizer (e.g., at the output of the receiving filter), enabling the use of a lower complexity equalizer. As described above, the BCJR complexity is $M^L$, where the complexity exponentially grows with the ISI length. A channel shortening process can be performed prior to the equalizer, which reduces the effective L enabling a reduction in the complexity of the equalizer. In some cases, the ISI memory elements at the edges of the ISI profile can be averaged, hence shortening the channel response and reducing the complexity (as described more completely in U.S. Pat. No. 9,154,346). In other embodiments, a shortening filter based on minimum mean-squared error (MMSE) criteria is used to generate a shortened version of the channel impulse response prior to the equalizer (e.g., at the output of the receiving filter).

In some embodiments, the equalizer contains a BCJR variant algorithm, with reduced complexity compared to the full complexity optimal BCJR algorithm that is a MAX-BCJR algorithm. In each stage of the full complexity BCJR algorithm, a state metric update is conducted at each state by summing all of the branch metrics from the connecting states of the previous stage. Instead of the full complexity summation operation, MAX-BCJR uses only the maximum branch metric to update the state metric, which avoids a plurality of summation operations (i.e., saves arithmetic operations), thereby reducing the overall algorithm complexity.

Figure 4:
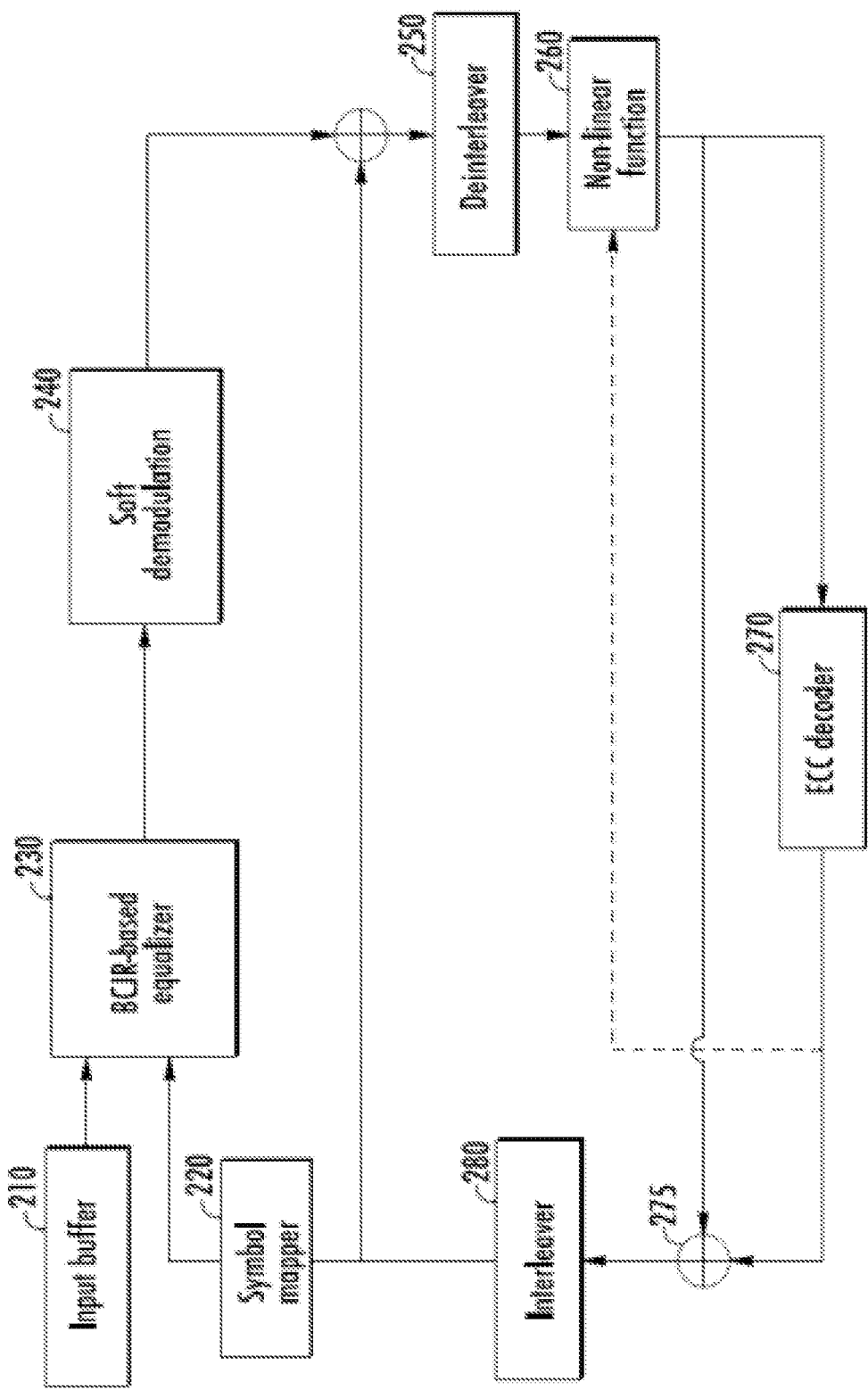
FIG. 4 shows a block diagram of a turbo equalization loop in a BCET system, in accordance with some embodiments.

FIG. 4 illustrates a turbo equalization loop, in accordance with some embodiments. Samples received from the channel are stored in the input buffer 210, which represents one input of the equalizer 230. The equalizer 230 in FIG. 4 corresponds to the equalization block 194 in FIG. 1. The extrinsic information produced by the ECC decoder 270, passed through the symbol mapper 220, is also taken to the input of the equalizer 230.

In some embodiments, the complexity of the trellis-based equalization process used by equalizer 230 is related to the cardinality of the linear modulation symbol alphabet (M) used, and the symbol memory length (L) induced by the BCET system. Complexity of the equalization process, and therefore hardware complexity, in such cases is proportional to $M^L$.

In some embodiments of turbo equalization loops, trellis-based equalizers, mainly BCJR and reduced complexity BCJR variants, like max-BCJR, M-BCJR, T-BCJR, forward-only BCJR, or windowed BCJR, are used. SOVA or even MMSE equalizer techniques can be used with restrictions as well. At the output of the BCJR-based equalizer, a soft demodulation block 240 is placed, which converts symbol likelihoods into the bit likelihoods.

In an alternative embodiment, and as a further complexity reduction, when pulse-shaping filter coefficients are real and 2-dimensional linear modulation is employed with cardinality M (for example QPSK, M=4), the pulse train can be modeled as two independent lower cardinality 1-dimensional modulation pulse trains (each with cardinality equal to $\log_2 M$), one on the I branch, and the other on the Q branch. The equalizer can then be formed by two lower complexity equalizers (complexity equal to $\log_2 M^L$ instead of $M^L$ where L is the symbol memory length induced by the BCET system) operating in parallel, and this can significantly reduce hardware complexity and hardware resources without any loss in the receiver overall performance. These I/Q branch equalizers could use any trellis based equalizer architectures (e.g., BCJR, or a reduced complexity BCJR variant). In this case, there is a parallel-to-serial conversion of symbol likelihoods produced by two I/Q equalizers prior to soft demodulation block 240 which converts them to bit likelihoods.

Extrinsic information of BCJR is obtained when the input bit-level log-likelihood ratios (LLRs) are substracted from the output bit-level LLRs. The result is passed through deinterleaver 250. Interleavers can take the sequence of symbols from its input and produce the identical symbols at the output, but in a different temporal order. In some embodiments, interleavers are used to disperse sequences in bit streams (or in streams of symbols) so as to minimize the effects of burst errors. The deinterleaver 250 and the ECC decoder 270 in FIG. 4 correspond to the deinterleaver/ECC decoder 196 in FIG. 1.

The use of reduced-complexity equalization techniques in turbo equalization schemes can significantly reduce the quality of the LLRs. The quality of the LLRs can strongly affect the system performance. In some embodiments, a non-linear function 260 can be optimized to transform a signal with low quality LLRs at the output of the deinterleaver 250, in order to maximize the effectiveness of the subsequent error control code optimization processes and iterative equalization and detection processes. For example, block 260 can be implemented in the form of a clipping circuit, an element that transforms a signal using a non-linear function that re-scales extrinsic LLRs, or an element that transforms a signal using a lookup table that incorporates a more elaborate distribution transformation. Non-linear LLR transformations can either be fixed from one turbo iteration to another, or can be adapted from iteration to iteration. Non-linear functions used by block 260 can be optimized based on different factors, for example: 1) estimated channel SNR; 2) pulse shaping response characteristics; 3) type of LDPC code applied; 4) decoding algorithm; and 5) other criteria. The non-linear transformation parameters can be pre-computed when an adaptive transformation law is applied, or they can be adapted on-the-fly based on the current codeword processed. Adaptation on the fly requires additional processing steps after the LDPC decoder block and adds to the overall complexity of the receiver 102. In some embodiments, the nonlinear operation can be precomputed and stored (e.g., as a look-up table, or map), which requires hardware memory space but does not result in an increase in system complexity. In other embodiments, the nonlinear operation can be computed on the fly, which increases the complexity of the system but does not require extra hardware memory. In some embodiments, a non-linear transformation is implemented in the form of an LLR clipping law. In these cases, threshold values can be pre-computed in advance by using Density evolution (DE) technique, so that the LDPC code employed has the largest DE threshold values.

Due to the serial nature of the trellis based equalizers, in order to achieve high throughput, in some embodiments, it is necessary to highly parallelize trellis based equalizers. In some embodiments, a received frame is divided into windows that are of equal length. And in some embodiments, the received frames are processed fully in parallel. In such cases, the number of windows can be chosen based on an optimization procedure with the criteria including: system throughput, hardware resources employed, and amount of degradation of the receiver performance compared to the a non-parallelized approach. Therefore, special attention should be paid to adequate interleaver design between the equalizer and the LDPC decoder in the receiver. In some embodiments, the interleaver supports a large number of equalizer windows, and is adapted to the layered LDPC decoder architecture, enabling fast transfer of LLRs between equalizer windows and LDPC decoder memories. In some cases, the interleaver is contention free. The underlying interleaving pattern can be deterministic, but can also emulate (or approximate) random pattern interleavers.

In some embodiments, an improved interleaver design is implemented. The interleaver can be designed with the following design goals: 1) include W equalizer windows and V LDPC memories (e.g., V=360 is an example of a possible LDPC parallelism level); 2) all LDPC memories are two port memories and each hardware memory is connected to two equalizer windows, and each hardware memory is divided in two hardware sub-memories, with each hardware sub-memory assigned to one equalizer window; 3) each equalizer window is connected to V/W hardware memories and serially sends data using a round-robin principle; and 4) the equalizer window address assignment is random. Since in a layered LDPC architecture, each LLR is read serially, LDPC reads a first location from the first hardware memory, then a first location from a second hardware memory and so on. In some embodiments, the above design goals can be modified to include more than two equalizer windows. The above described interealver design is a hybrid between random and block interleavers, and can achieve a high parallelism level with simple timing control. Simulations show that there are no losses in such systems compared to fully random interleavers.

Continuing with FIG. 4, the output of 260 defines input LLRs of the ECC decoder 270. In some embodiments, the code used as an ECC should be capacity approaching code and designed for attainment of performance closer to the constrained bandwidth channel capacity. In some embodiments, LDPC capacity approaching code is used as an ECC code.

In some embodiments, the LDPC code structure is optimized using the following requirements: 1) the code belongs to the irregular repeat accumulator (IRA) class of codes, that enables linear complexity of the encoding; 2) a parity check matrix can be rearranged in quasi-cyclic (QC) form, that enables layered decoding without hardware memory conflicts; 3) a degree distribution and parameters of the turbo loop are optimized for the known partial response channel and required level of parallelism; and 4) the designed code compensates imprecision caused by any reduction of the complexity of the equalization part of a turbo loop, as described above.

In some embodiments, the LDPC code is decoded using an iterative method using belief propagation or sum-product message passing (i.e., a message passing algorithm that is an optimal method for iterative decoding of LDPC codes). However, the optimality of sum-product message passing comes at the cost of a high complexity, numerical instability, and dependence on noise variance estimation (i.e., SNR estimation).

In some embodiments, a lower complexity LLR calculation in LDPC decoding can be used such as a min-sum algorithm (e.g., 3-min-sum, or 5-min-sum) that trade performance, or optimality for complexity of implementation. For the min-sum algorithm, complex computations in the sum-product algorithm are approximated using simpler comparison and summation operations (hence the "min-sum" name). 3-min-sum and 5-min-sum refer to versions of the algorithm with different numbers of elements used in the comparison logic of the algorithm. In some embodiments, a 5-min-sum algorithm is used in a BCET system with a turbo loop (i.e., iteration between the LDPC decoder and the equalizer), and negligible performance loss is observed compared to the same system using a sum-product solution.

In some embodiments, the LDPC code optimization process uses the distribution of the constituent variable node degrees and check node degrees, as well as the parameters of the non-linear function inside the turbo equalization loop (described above). The optimization can also be based on the density evolution for partial response channels, and on producing an optimized degree distribution that satisfies a predefined set of constraints that enable the construction of structured QC IRA codes (for a desired decoder complexity and level of parallelism).

In some embodiments, the parity check matrix in the LDPC code optimization process ensures that the QC structure is suitable for layered decoding. In addition, enabling low complexity encoding is an important optimization constraint. In some embodiments, the above constraints on the LDPC code optimization process reduce the search area in which the optimization algorithm looks for the degree distribution of the irregular code that provides the minimal value of the SNR threshold, thereby reducing system complexity.

In some embodiments, a layered LDPC decoder architecture is employed.

In some embodiments, the receiver performance of the BCET system depends on the number of iterations in the turbo loop and the internal LDPC decoder iterations in the receiver. Larger bandwidth constriction produces more severe ISI (or symbol memory) in the system. When there is a more severe ISI in the system, the turbo equalization scheme needs more iterations to remove the ISI and to achieve the desired LDPC decoder performance (for a given SNR). The number of turbo iterations is a trade off between the required BCET performance, hardware complexity, and system throughput.

Figure 5:
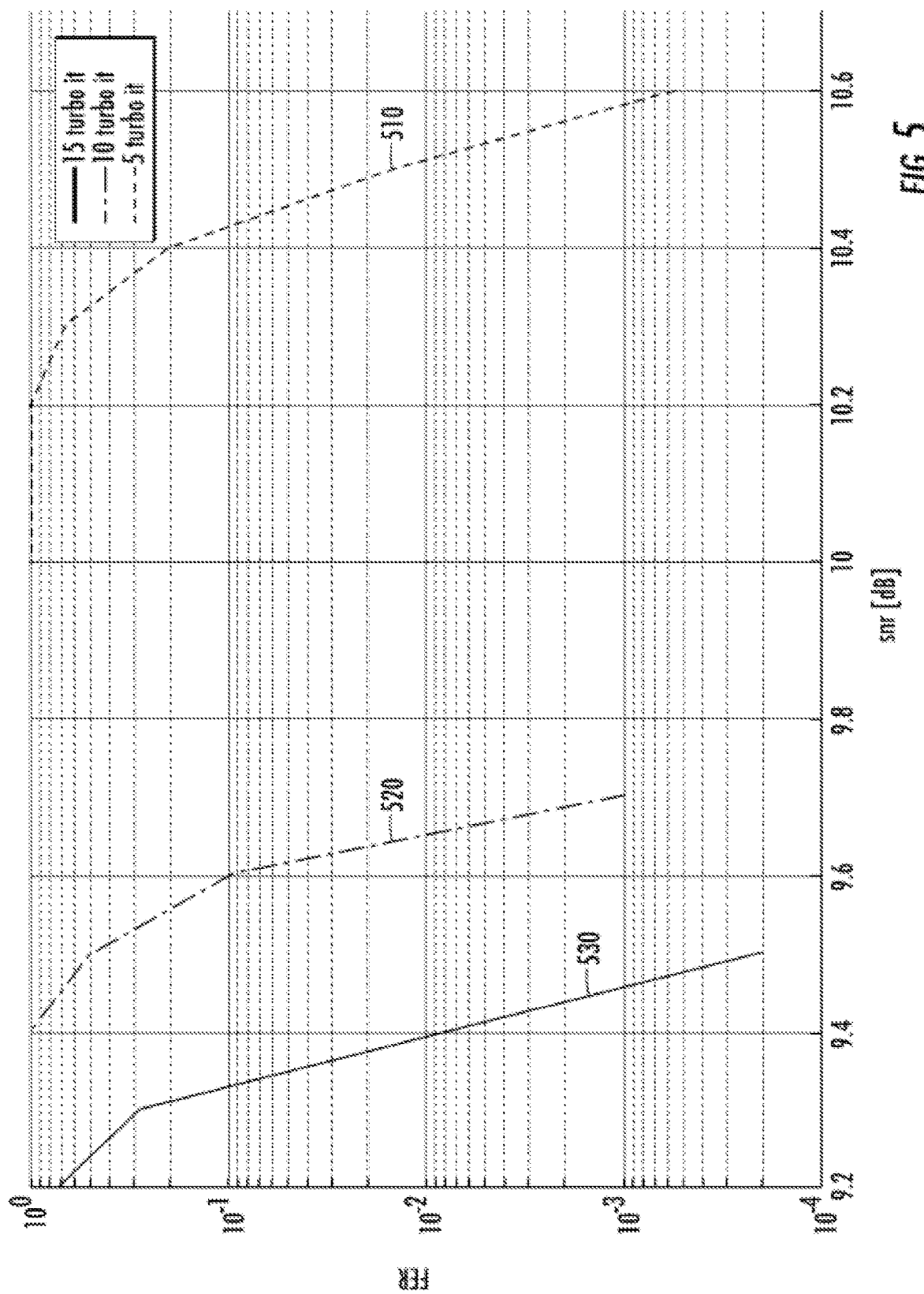
FIG. 5 shows frame error rate (FER) performance with different number of turbo iterations, in accordance with some embodiments.

FIG. 5 illustrates an example of system Frame Error Rate (FER) performance with different number of turbo iterations. The FER versus SNR for a BCET system with a turbo loop (e.g., as shown in FIG. 4) are plotted in curves 510, 520 and 530, corresponding to 5, 10 and 25 turbo iterations in the recover, respectively.

As described above, bandwidth constrained equalized transport (BCET) systems (e.g., similar to those described in U.S. Pat. Nos. 8,155,530, and 10,020,912) increase spectral efficiency of the transmission by narrowing the transmission bandwidth, while retaining a constant information rate.

By stepping into the faster-than Nyquist (FTN) signaling realm, a BCET system relies on proper pulse shaping and equalization techniques to control the ISI. The present BCET systems additionally include error control coding techniques that enable reliable data transmission using practical hardware complexity. In some embodiments, the systems and methods described herein can increase the information rate in satellite communications, for example, using similar system parameters as in DVB-S2 and DVB-S2X standards, or using other wireless communication standards (e.g. 5G, WiFi, xDSL).

The low-density parity-check codes (LDPC) described in the DVB-S2 and DVB-S2X standards, optimized for additive white Gaussian noise (AWGN) channels, are not adequate solutions in BCET systems. In some embodiments, the present systems and methods are used to optimize the degree distribution for irregular LDPC codes, which satisfy requirements related to the impulse response of the partial response channel, required complexity of the equalizer, required information rate, and data throughput. In some embodiments, the degree distribution of both the variable nodes and the check nodes, as well as the parameters of the non-linear function in the turbo equalization loop are optimized together. This optimization can result in improved system performance for a given signal-to-noise ratio (SNR) and information rate. The value of the SNR that ensures that the FER is below a predetermined level can be denoted as a "turbo cliff". Therefore, in some embodiments the goal of the optimization is to minimize the turbo cliff (i.e., minimizing the SNR required to achieve a low FER) for a given information rate and for a particular (e.g., limited) complexity of a turbo equalizer. Optimizing for a particular system complexity is important, because typically processing power and hardware memory resources are limited. As the processing latency determines throughput, the optimization is performed for a limited number of iterations, in some embodiments.

Referring again to FIG. 1, in some embodiments, the ECC encoder 110 contains a cascade of two codes: an outer block encoder and an inner LDPC error-correction code encoder. The systems and methods described herein, such as the system shown in FIG. 1 and methods that can be performed using the system shown in FIG. 1, including the above ECC encoder description, are applicable to a wide range of transmission technologies and/or communication protocols. For example, the systems and methods described herein can be used for binary and/or multiary (M-ary) information streams, as well as in M-ary modulation modes. The systems and methods described herein are also applicable to BCET systems with any bandwidth narrowing factor and/or level of equalizer complexity.

Referring again to FIGS. 1 and 4, in some embodiments, ECC encoder (110 in FIG. 1) contains a cascade of two codes: an outer block encoder and an inner LDPC error-correction code encoder, and the ECC decoder (270 in FIG. 4) in the turbo equalization loop is an LDPC decoder. In this case, the extrinsic information produced by the LDPC decoder 270, is passed through the symbol mapper 220, and is taken to a second input of the equalizer 230. In some embodiments, the equalizer 230 is a trellis-based equalizer, such as a BCJR equalizer and its reduced complexity variants (e.g., max-BCJR, M-BCJR, T-BCJR, forward-only BCJR, or windowed BCJR equalizers). In some embodiments, the equalizer 230 utilizes Viterbi or MMSE equalizer techniques. At the output of BCJR-based equalizer 230, soft demodulation block 240 is placed, which converts symbol likelihoods into the bit likelihoods.

Continuing with FIG. 4, extrinsic information from the BCJR equalizer 230 is obtained when the input bit-level LLRs are substracted from the output bit-level LLRs. The result is passed through deinterleaver 250. Non-linear function 260 can then transform opportunistic LLRs (opportunism is a consequence of employing non-optimal equalization techniques) at the output of the deinterleaver 250 to an appropriate form, in order to maximize the effects of code optimization. The non-linear function block 260 can be optimized as well, can be implemented in the form of a clipping circuit, can utilize a polynomial function, sigmoidal function, or a function that re-scales extrinsic LLRs, or can utilize a lookup table that incorporates more elaborate distribution transformation, as described above. In the case that the ECC decoder 270 utilizes LDPC codes, the outputs of 260 are the input LLRs of the LDPC decoder 270. Furthermore, extrinsic information of the LDPC decoder 270 is obtained when the input LLRs are substracted from the output bit-level LLRs in block 275, which is after ECC decoder 270 and before interleaver 280. The result is passed through interleaver 280 to the symbol mapper 220, which closes the loop.

The decoded signals (containing a set of symbols) can be output from the turbo equalization loop from the ECC decoder 270. In some cases, the decoded signals can be output from the turbo equalization loop from another processing block, such as from symbol mapper 220.

Figure 6:
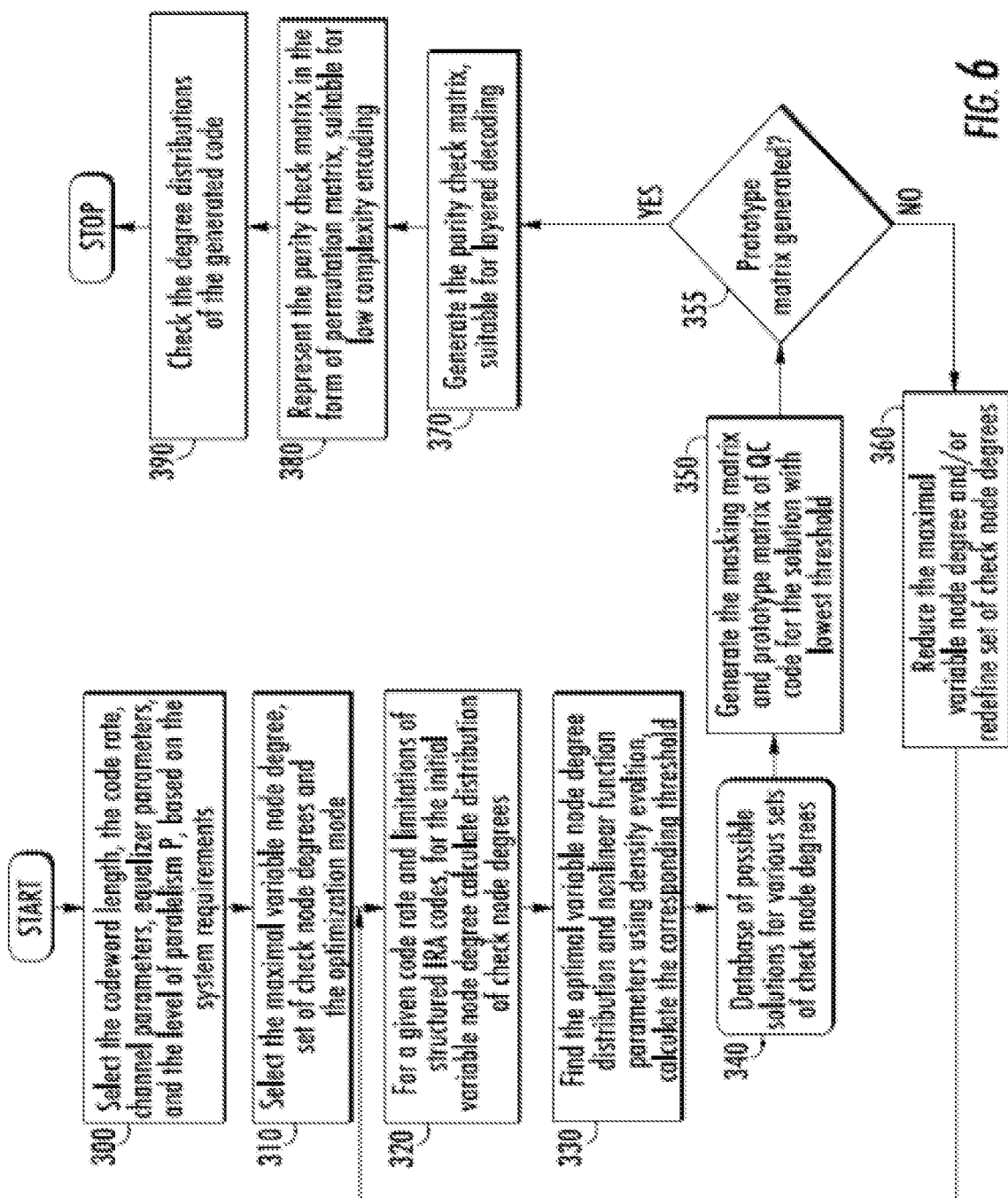
FIG. 6 is a simplified flowchart for a process for optimizing low-density parity-check (LDPC) codes in BCET systems, in accordance with some embodiments.

In some embodiments, the ECC encoder and decoder utilize LDPC codes, and an LDPC code optimization process is performed, which includes optimizing the distribution of the variable node degrees and check node degrees, as well as the parameters of the non-linear function. The optimization can be based on the density evolution for partial response channels, and the produced optimized degree distributions can satisfy a predefined set of constraints that enable the construction of structured QC IRA codes, for a desired complexity of the decoder and level of parallelism. An example of a process for LDPC code optimization is shown in FIG. 6, in accordance with some embodiments. The LDPC code optimization process can also depend on the type of pulse-shaping optimization procedure used in the system (examples of pulse-shaping optimization procedures for the present systems are described above).

In some embodiments, the parity check matrix has a QC structure that is suitable for layered decoding. Additionally, in some embodiments, the parity check matrix is designed to minimize the complexity of encoding. The constraints on the parity check matrix imposed by the above optimizations can be used to reduce the search area in which the optimization algorithm looks for the degree distribution of the irregular code that provides the minimal value of the SNR threshold.

In one possible optimization setup (mode 1), only a part of the variable degree distribution is optimized, while another part of the distribution is predefined. In such a case, the columns with weight equal to 2 can be placed in a double diagonal matrix only, the check node degrees can be fixed to two successive values, and the check node distribution can be determined with the code rate and structural properties of QC IRA codes. In another scenario (mode 2), the columns with weight equal to 2 can be placed in the double diagonal matrix, and can also be placed in the rest of the parity check matrix.

As shown in FIG. 6, the optimization process starts at step 300 by selecting the dimensions of a parity check matrix (that define a codeword length and a code rate), equalizer parameters, and a level of parallelism P, according to the system requirements.

Then, at step 310 the maximum variable degree is chosen, and set of the check node degrees is fixed. The optimization mode, as described above, is also selected in step 310. In step 320 the variable node distribution is initialized, and the distribution of check node degrees is calculated for the given input parameters. In other words, in step 320, for a given code rate and limitations of structured IRA codes (i.e., those selected in steps 300 and 310), the distributions of the check node degrees for the initial variable node degree are calculated.

Using a density evolution algorithm for partial response channels, the degree distribution and parameters of the non-linear function are optimized, and the corresponding threshold is calculated in step 330. In other words, in step 330, the optimal variable node degree distribution and nonlinear function parameters, along with the corresponding thresholds, are found using density evolution. The procedure in step 330 is repeated for an appropriate subset of initial conditions, and a database of the possible solutions for the various resulting sets of check node degrees is generated in step 340.

In some embodiments, the parity check matrix H contains two parts, a first part H1 and a second part H2, such that H=[H1 H2], where H2 is a double diagonal matrix and H1 is the quasi-cyclic part of the parity check matrix with the structure determined by a random masking matrix that satisfies the degree distribution condition. Each binary zero in the masking matrix can correspond to a P×P zero submatrix in H1, and every binary one in the masking matrix can correspond to a cyclically shifted eye submatrix with dimensions P×P. The corresponding values of the shifts in the cyclically shifted eye submatrices (e.g., in the range [0, 1, . . . , P−1]) are defined in a prototype matrix and can be generated by using an appropriate algorithm, as described in more detail herein. Starting from the degree distribution that corresponds to H, and taking into account a simple structure of H2, the degree distribution that corresponds to H1 is calculated, in some embodiments. By using this distribution, the random masking matrix is generated, and the prototype matrix is produced in step 350 (e.g., as will be described further below and in FIG. 7). This process is repeated for the appropriate set of check node degrees, and the solution that results with the lowest threshold is identified. In other words, the masking matrix and the prototype matrix that are generated in step 350 are optimized for the solution with the lowest threshold. At decision step 355, if it is not possible to construct a prototype matrix (e.g., if the maximal variable node degree was too large), then the maximal variable node degree is reduced and/or the set of check node degrees is redefined in step 360. After step 360, these new initial conditions are used to reoptimize the degree distribution by repeating steps 320 through 350. Steps 360, and 320 through 350 can be repeated until the prototype matrix is successfully generated (i.e., until the decision at step 355 is "YES").

The prototype matrix is an intermediate result before generating a parity check matrix. At decision step 355, if it is possible to construct a prototype matrix, then the parity check matrix suitable for layered decoding is generated at step 370. The parity check matrix is then represented in the form of the corresponding permutation matrix that is suitable for low complexity encoding at step 380, and the real degree distribution of the generated code is estimated and checked at step 390.

Figure 7:
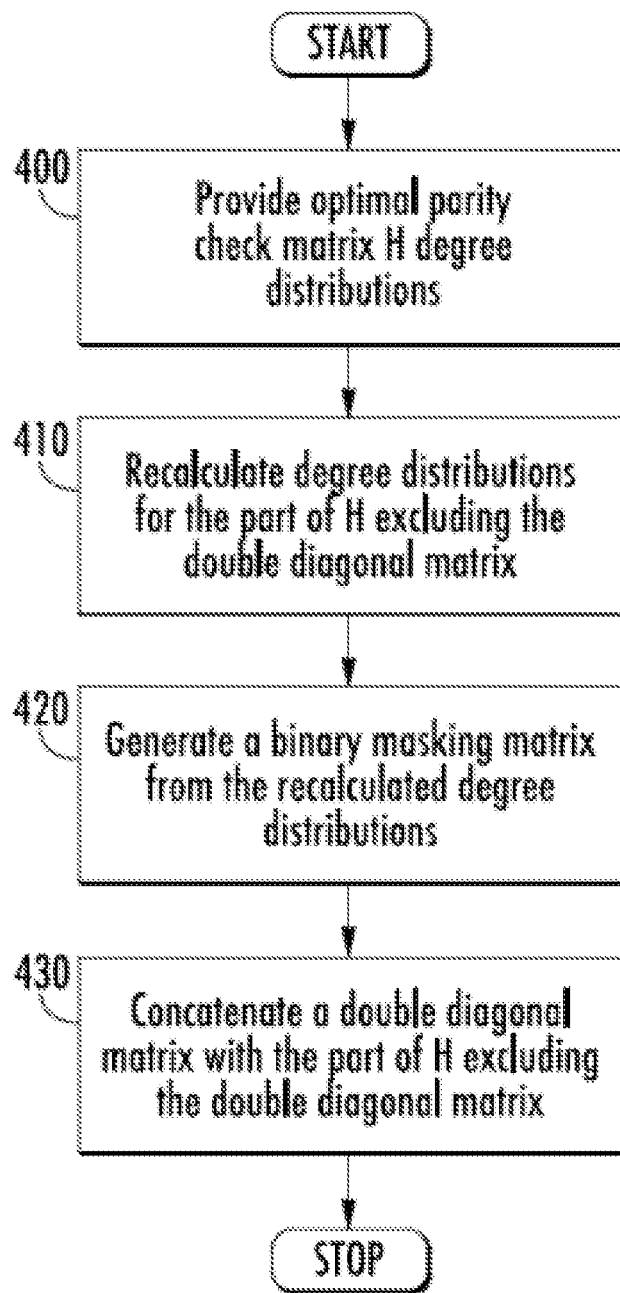
FIG. 7 is a simplified flowchart for a process for generating a quasi-cyclic (QC) irregular repeat accumulator (IRA) code design in BCET systems, in accordance with some embodiments.

FIG. 7 is an example process for constructing the prototype matrix, in accordance with some embodiments. In some embodiments, the prototype matrix has nR/P columns and (1−R)n/P rows, where R is the code rate (e.g., R=3/5), n is the codeword length (e.g., n=16200), and P is the level of parallelism (e.g., P=360). In some embodiments, the prototype matrix is a matrix of integers, in which each element of the matrix denotes a cyclic shift of an eye P×P matrix in the $H_1$ part of the parity check matrix. In such cases, as a result, the prototype matrix is P times smaller than the $H_1$ matrix.

The prototype matrix can be generated in a few successive steps. In step 400, known optimal degree distributions for the parity check matrix (H) In step 410, the degree distribution is recalculated, to correspond to the first part of matrix H (denoted by $H_1$). In step 420, a binary masking matrix with size (1−R)n/P×nR/P is generated from the recalculated degree distribution. In step 430, the double diagonal matrix (denoted by $H_2$) is concatenated with the matrix $H_1$ such that H=[$H_1$ $H_2$], to complete the parity check matrix H.

Figure 8:
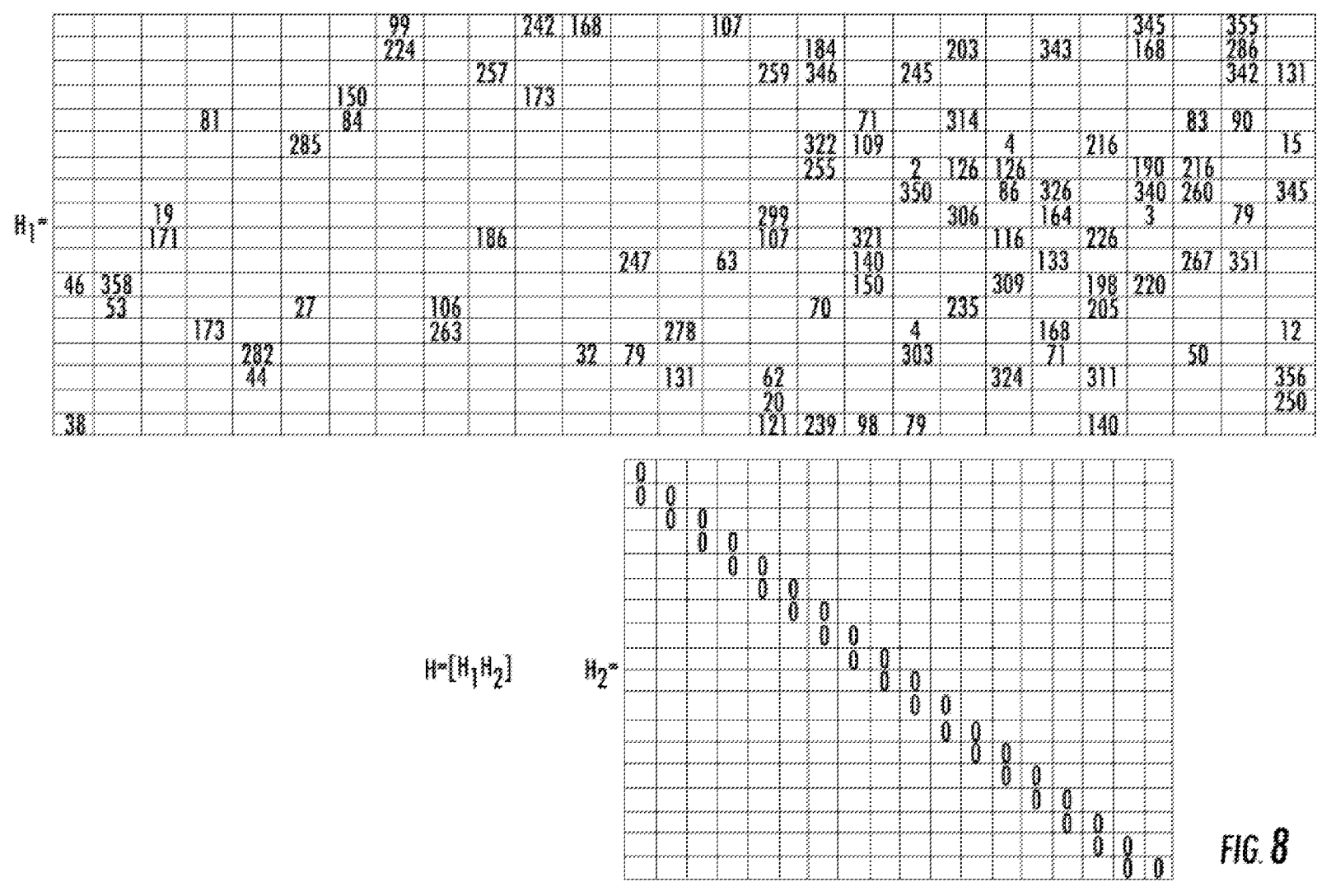

Using the present systems and methods, the prototype matrix can directly determine the structure of matrix H. In some embodiments, both dimensions of the prototype matrix are P times less than those of the first part of the parity check matrix ($H_1$), and every element in the prototype matrix defines a number of cycle shifts in a corresponding submatrix with size P×P. For example, FIG. 8 shows a matrix H2 with dimensions 6480×6480. The matrices H, $H_1$ and $H_2$ in FIG. 8 are shown using a compact description where the sizes are reduced by P times. In the example matrix $H_2$ in FIG. 8, every "0" corresponds to an eye matrix with site 360×360 (with no shifts), and the blank cells correspond to zero matrices with size 360×360 in the corresponding parity check matrix. The example matrices in FIG. 8 correspond to a parity check matrix for a code rate R=3/5, codeword length n=16200, and level of parallelism P=360, and is obtained by using the systems and methods described above. The matrix H has a size 6480×16000, and the maximum column and row degree are equal to 6 and 8, respectively.

Figure 9:
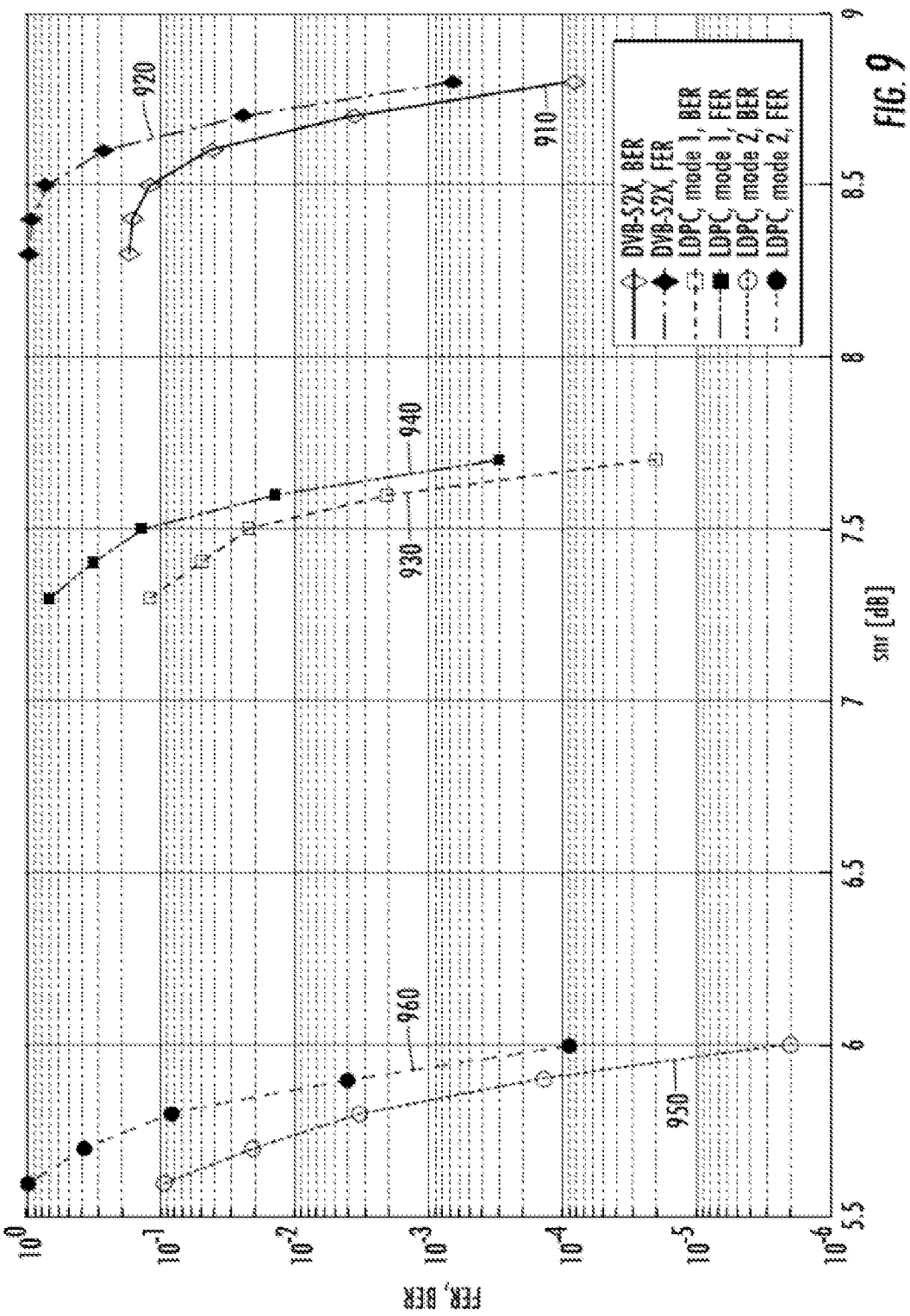
FIG. 9 shows achieved FER and bit error rates (BER) for BCET systems with optimized LDPC codes, in accordance with some embodiments.

FIG. 9 shows example error performance for a BCET system (e.g., the system shown in FIGS. 1 and 4) utilizing structured QC IRA codes with optimized degree distributions. The error performance is evaluated for partial response channel with the impulse response g=[0.0021 0.1252 0.3331 0.5329 0.5839 0.4461 0.2226], where the two first coefficients are ignored and renormalization is applied. The results are given for BPSK modulation (two parallel streams, one per each quadrature), codeword length n=64800, code rate R=1/2 and circulant size P=360. The total number of trellis states is $S=2^5=32$, and windowed BCJR with 80 segments is applied. Both the BER and FER are plotted for the standard control ("DVB-S2X, BER" 910 and "DVB-S2X, FER" 920), the optimized LDPC codes designed in mode 1 ("LDPC, mode 1, BER" 930 and "LDPC, mode 1, FER" 940), and the optimized LDPC codes designed in mode 2 ("LDPC, mode 2, BER" 950 and "LDPC, mode 2, FER" 960).

The data in FIG. 9 illustrates that the optimized LDPC code designed in mode 1 provides an error performance gain of approximately 0.7 dB compared with the corresponding code from DVB-S2X standard. The data in FIG. 9 also shows that the optimized LDPC codes designed in mode 2 provide an additional gain of about 1.4 dB. In both cases, a Bose, Chaudhuri, and Hocquenghem (BCH) code is used as an outer code, and corrects up to t=12 errors per codeword.

Two optimization modes (mode 1 and mode 2) are described above. In the first mode (mode 1), LDPC codes were designed to achieve excellent performance without using any outer code. In the second mode (mode 2), inner codes were designed that have good performance in the waterfall region, but with poor performance in the error floor region compared to general LDPC code properties. However, when the outer code that corrects up to t errors is applied, the codes designed in mode 2 can have even better performance that the codes designed in mode 1.

Figure 10:
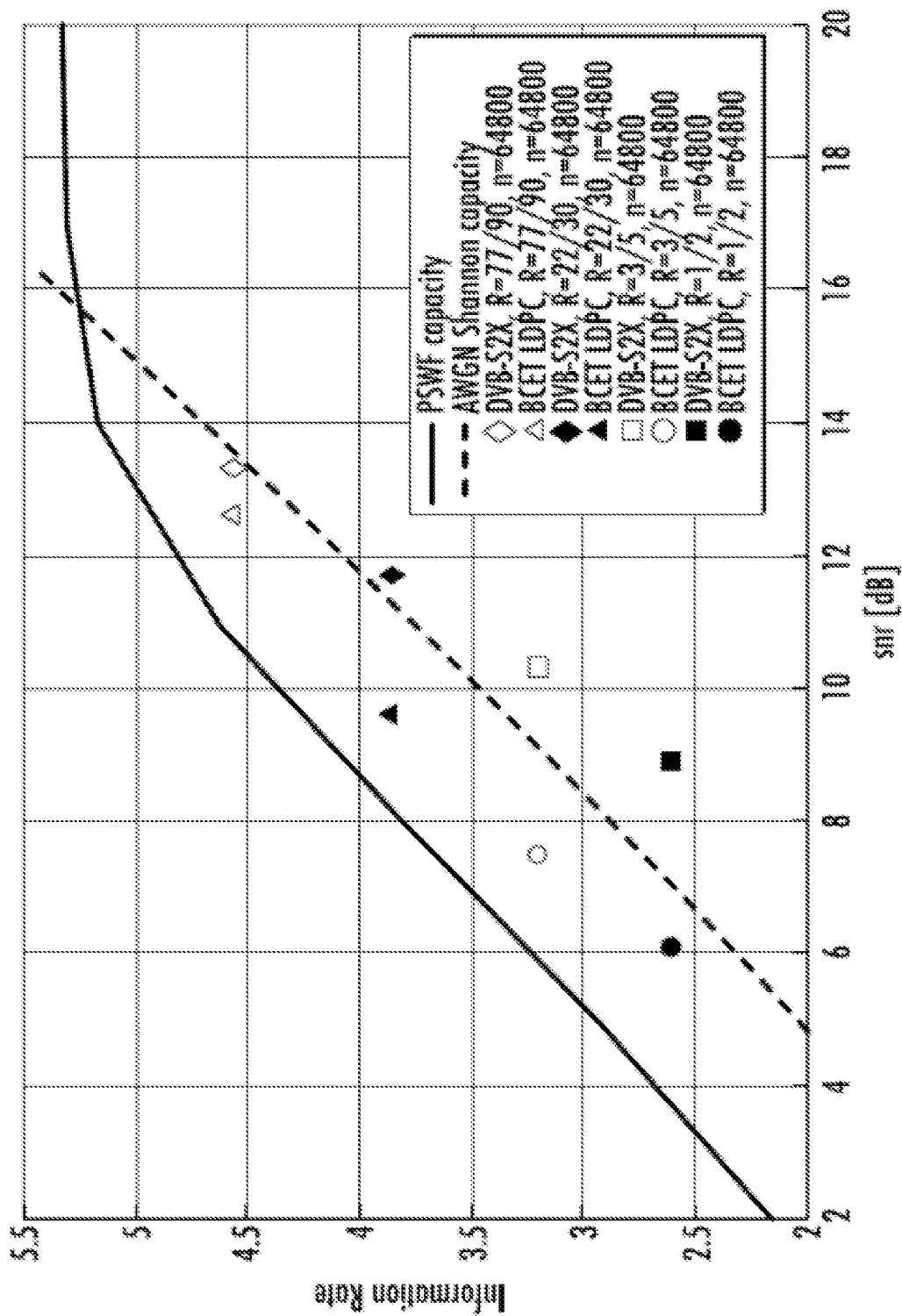
FIG. 10 shows achieved information rates for four code rates, in accordance with some embodiments.

FIG. 10 illustrates an example performance for various LDPC code rates and spectral efficiency regions, for BCET systems described herein such as system 100 shown in FIG. 1. In the chart in FIG. 10, the data depicted using diamond and square symbols (labelled "DVB-S2X . . . " in the legend) use conventional LDPC encoders, while data depicted using triangle and circle symbols (labelled "BCET LDPC . . . " in the legend) use the improved LDPC encoders described herein. The different data points were also produced using different code rates ("R"), code word lengths ("n"), as shown in the legend of the graph in FIG. 10. All of the data shown in FIG. 10 was produced by systems with turbo equalization loops. The Shannon limit curve (labelled "AWGN Shannon capacity" in the legend) is shown as a dashed line, and the PSWF capacity (labelled "PSWF capacity" in the legend) is shown as a solid line. The PSWF capacity is the capacity of the system given a large number of turbo equalization loop iterations (e.g., 100 turbo iterations) and long code word lengths (e.g., n=106). FIG. 10 shows that the information rate (i.e., spectral efficiency) achieved by the present pulse-shaping optimization procedures, and bandwidth constriction in the transmitter, surpass the traditional Shannon capacity curve. FIG. 10 also shows that by using the current narrowband filtering coupled with industry existing LDPC parity check matrices (e.g., which are optimized for use in traditional orthogonal communications systems with only AWGN present in the channel, and which are not optimized for the channel with inherent inter-symbol interference in the channel), system performance is very close to the traditional Shannon curve and even slightly above for larger code rates (operating points are represented with diamond and square symbols). This is due to inherent system capacity improvements obtained in systems with optimized transmitter side pulse-shaping and turbo equalizer loop architectures. FIG. 10 also shows that when the presently described optimized LDPC codes are applied, the system can operate well above the Shannon curve (operating points are represented with triangle and circle symbols). In other words, FIG. 10 shows that, using the systems described herein, narrowband filtering coupled with traditional LDPC codes is able to breach Shannon limit, and that narrowband filtering coupled with the improved LDPC codes described herein enables further improvements beyond the Shannon limit.

FIG. 10 shows the information rates that can be achieved for four code rates (i.e., R=1/2, R=3/5, R=22/30 and R=77/90). The numerical results in FIG. 10 are given for the channel with the same impulse response as in FIG. 9, a QC LDPC with the degree distribution optimized according to mode 2, with codeword length n=64800, and circulant size P=360. The data in FIG. 10 was generated using a BCET system (e.g., the system shown in FIGS. 1 and 4) including 15 turbo iterations and a windowed BCJR with 80 segments. The results are about 1.5 dB to 2 dB away from PSWF channel capacity, but more than 1 dB better than the capacity of the AWGN channel. For R=1/2, the optimization of the code degree distributions resulted in the performance gain of 2.8 dB compared with the DVB-S2X code with the same code rate.

Figure 11:
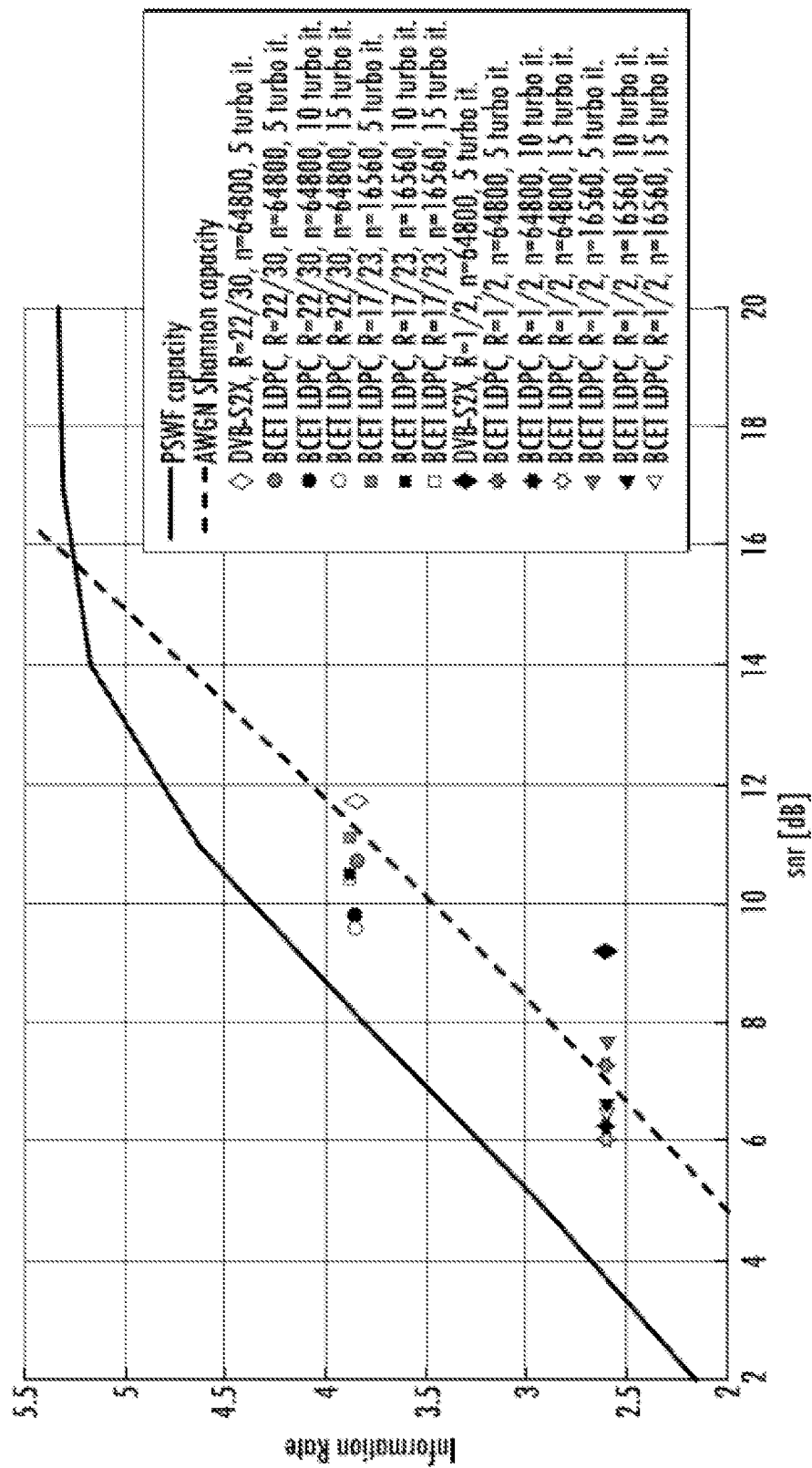
FIG. 11 shows achieved information rates for various codeword lengths and various number of turbo iterations, in accordance with some embodiments.

FIG. 11 illustrates the dependency of the system performance on the number of turbo iterations in the receiver's turbo equalization loop, in some embodiments. The data depicted using diamonds (and labelled "DVB-S2X . . . " in the legend) use conventional LDPC encoders, while the data depicted using other symbols (i.e., circles, squares, stars, and triangles and labelled "BCET LDPC . . . " in the legend) use the improved LDPC encoders described herein. The different data points also use different code rates ("R"), code word lengths ("n"), and number of turbo iterations ("turbo it"). The Shannon capacity and the PSWF capacity are shown as they were in FIG. 10. The number of turbo iterations is a trade off between the system performance, throughput, and the receiver hardware complexity. FIG. 11 shows that by allowing more turbo iterations in the loop, BCET systems can operate closer to inherent capacity (PSWF capacity) and surpass traditional Shannon capacity bounds.

FIG. 11 shows the information rates for BCET systems for different code rates, codeword lengths, and numbers of turbo iterations. The data in FIG. 11 shows that for codeword lengths approximately four times shorter (i.e., n=16560 compared to n=64800), the same information rate can be achieved for signal-to-noise ratio that is 0.7 dB smaller. For both codeword lengths and all code rates shown in FIG. 11, a reduction in the number of turbo iterations from 15 to 10 results in performance degradation of about 0.2 dB, and a further reduction to 5 turbo iterations corresponds to an additional degradation of approximately 1 dB.

Several embodiments of a transmitter in systems employing narrowband filtering (e.g., BCET systems) will now be described.

In some embodiments, a transmitter in a system employing narrowband filtering comprises: 1) a pulse-shaping filter that is specifically designed for maximization of achievable information rates and high spectral efficiency, with different possible optimization criteria, such as lowest possible induced symbol memory (i.e., intentionally induced inter-symbol interference that can minimize receiver complexity); and 2) an error control code encoder used to append redundant information so as to avail information symbols' retrieval in the presence of noise and impairments, wherein the code structure is specifically designed along with the pulse-shaping design procedure (e.g., achieving performance closer to the achievable information rates than conventional systems). In some embodiments, the transmitter is for use in a digital communication system conveying information symbols at a certain symbol rate in which the information bearing waveforms are filtered to a bandwidth significantly narrower than the communication symbol rate; and wherein the apparatus achieves an improved energy performance and increased spectrum efficiency compared with systems not employing the bandwidth constraint.

In some embodiments, the system described above, further comprises a receiving filter. In some embodiments, the receiver further comprises an optional transmission impairments mitigating equalizer, which is prior to the information retrieving equalizer. In some embodiments, the receiver further comprises a channel response adjustment (or, impulse response adjustment) as an optional additional processing block prior to information retrieving equalization. In some embodiments, the information retrieving equalizer outputs the reliability estimates, often referred to as the soft information of the information symbols. In some embodiments, the information receiving equalizer functions as a trellis-based equalizer (e.g., a BCJR or SOVA equalizer), or as a reduced complexity trellis-based equalizer (e.g., a M-BCJR, T-BCJR, or SOMA equalizer). In some embodiments, the information receiving equalizer is divided in two parallel independent equalizers, one processing an I demodulator branch and the other working on a Q demodulator branch of a signal, thus significantly reducing the complexity of each equalizer. In some embodiments, the information receiving equalizer functions as a windowed variation of a maximum a posteriori equalizer that can work fully in parallel. In some embodiments, the information receiving equalizer supports a very large number (e.g., 72, or up to 80, or up to 100, or greater than 100) of windowed MAP equalizers which are fully parallel and independent (or in a slight sliding window variant), thus achieving large system throughputs. In some embodiments, iterative detection is employed, wherein the information retrieving equalizer outputs likelihood estimates LLRs on the received symbols and pass it on to the error control decoder with the information retrieving equalizer and the error control decoder iteratively exchanging their estimates on the received information for a number of times (i.e., in a turbo equalization loop).

In some embodiments of the system described above, non-linear transformation of LLRs (e.g., low quality LLRs) is employed in order to transform them into an appropriate optimized form for turbo equalization loop constituents (i.e., equalizer and error control decoder), which can significantly improve overall system gain. In some embodiments, soft information LLRs are interleaved/deinterleaved between turbo equalization loop constituents. In some embodiments, the turbo equalization loop has a plurality of iterations (i.e., turbo iterations) and the number of iterations is optimized for attainment of performance closer to the optimized achievable information rates and overall system throughput. In some embodiments, turbo loop interleavers/deinterleavers are specifically designed to support a high level of parallelism of windowed equalizer and are quasi-random and contention free.

In some embodiments, a BCET communication system contains a transmitter that employs a pulse-shaping filter, and the filter response is designed using a numerical optimization procedure.

In some embodiments, a BCET communication system contains a receiver that employs joint channel symbol detection and error control code symbol detection that are combined using iterative decoding. In some embodiments, the error control code is obtained by a numerical optimization procedure.

In some embodiments, a BCET communication system contains an early termination criterion for LDPC codes to reduce the number of LDPC iterations, which in turn results in the overall reduction of the duration of the processing performed by the turbo equalization loop. This can be advantageous, for example, by enabling substantial power savings at the receiver.

In some embodiments, a BCET communication system contains an outer block code, such as a BCH code or a Reed-Solomon code.

In some embodiments, a method for optimizing LDPC codes in BCET systems includes: a) providing a parity check matrix of a low-density parity-check (LDPC) code, which is employed in error correction techniques in turbo-equalization-based bandwidth-constrained communication systems; and b) determining an optimized non-linear transformation of input log-likelihood ratios (LLRs) to the error correction decoder adjusted jointly with the parity check matrix.

In some embodiments, the method for optimizing LDPC codes in the BCET systems above further includes the utilization of an equalizer that operates using BCJR (Bahl-Cocke-Jelinek-Raviv) algorithms, Viterbi algorithms, reduced trellis states, and/or reduced trellis search variants of BCJR and Viterbi algorithms.

In some embodiments, the method for optimizing LDPC codes in the BCET systems above further includes the utilization of a plurality of equalizer complexity reduction techniques and/or partial response channel shortening.

In some embodiments, the method for optimizing LDPC codes in the BCET systems above further includes the utilization of pulse-shaping and receiving filters such as those described above and in U.S. Patent Application Pub. No. 2014/0269894, and U.S. Pat. No. 9,154,346.

In some embodiments, the method for optimizing LDPC codes in the BCET systems above results in the optimized transmission system outperforming ISI-free transmission in terms of achievable information rate, for the same signal-to-noise ratio (SNR) and the same occupied bandwidth.

In some embodiments, the method for optimizing LDPC codes in the BCET systems above results in an optimized transmission system that outperforms the ISI-free transmission in terms of signal-to-noise ratio (SNR), for the same achievable information rate and the same occupied bandwidth.

Figure 12:
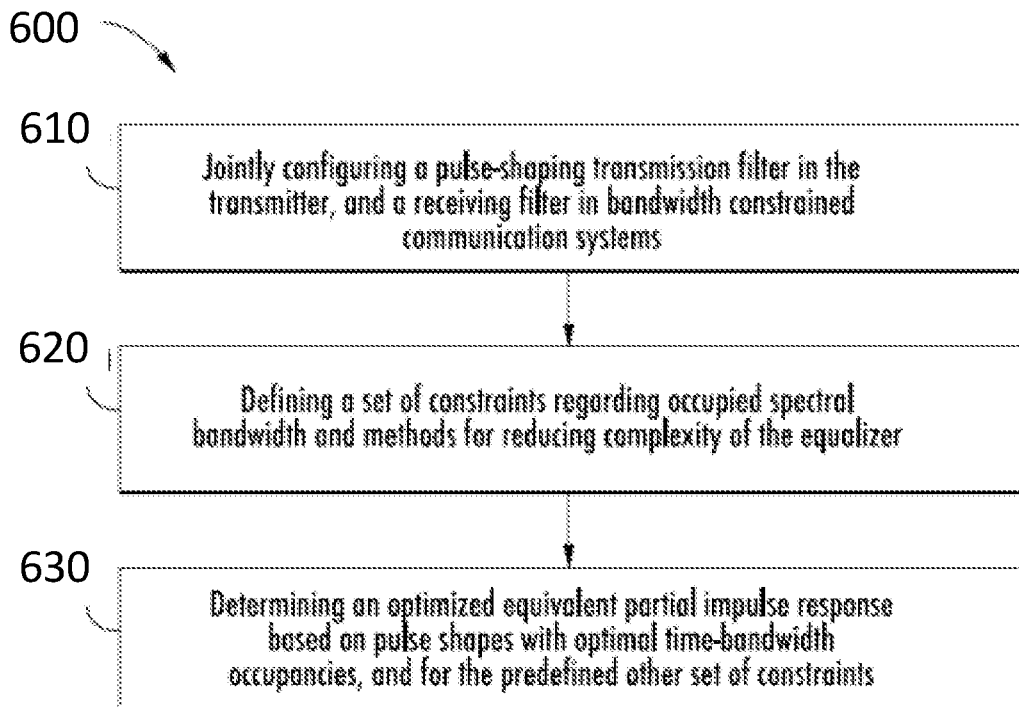
FIG. 12 is a simplified flowchart for a process for BCET, in accordance with some embodiments.

FIG. 12 shows an example of a receiver processing architecture method 1200 that can be performed using the systems described above, in some embodiments. In some embodiments, a method comprises: a) jointly configuring a pulse-shaping transmission filter (in the transmitter), a receiving filter, and an optional channel impulse response adjustment block (in the receiver) in bandwidth-constrained communication systems (in step 1210); b) defining a set of constraints regarding occupied spectral bandwidth and methods for reducing complexity of the equalizer (in step 1220); and c) determining an optimized equivalent partial impulse response, which maximizes achievable information rate of a transmission system, based on pulse shapes with optimal time-bandwidth occupancies (e.g., using prolate spheroidal wave functions or Gaussian functions), and for the predefined other set of constraints (in step 1230). In some embodiments, the method described above further includes a pulse-shaping filter that satisfies a set of pre-defined constraints regarding the spectral mask, in the presence of non-linear distortion of the transmitted signal.

Figure 13:
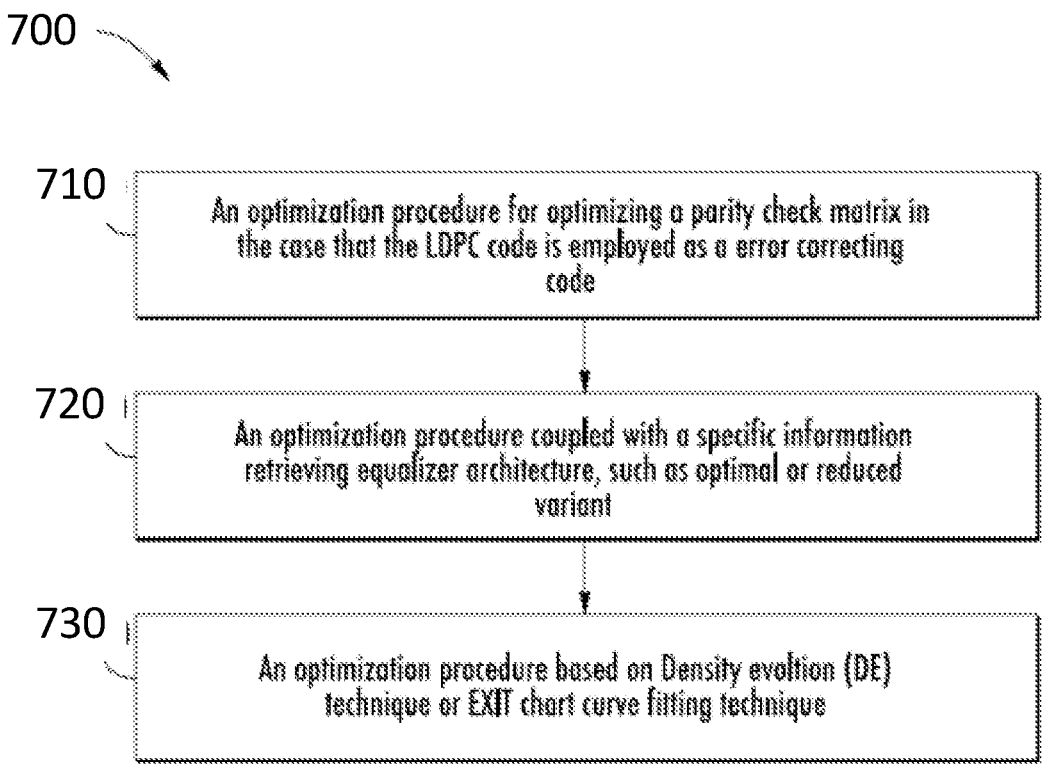
FIG. 13 is a simplified flowchart for a process for BCET, in accordance with some embodiments.

FIG. 13 shows an example of a method 1300 for optimizing LDPC codes that can be performed using the systems described above, in some embodiments. In some embodiments, a method comprises: a) performing an optimization procedure for optimizing a parity check matrix in a case in which the LDPC code is employed as an error correcting code (e.g., in the communication system described above) (in step 1310); b) performing an optimization procedure coupled with a specific information retrieving equalizer architecture, such as an optimal or reduced variant (in step 1320); and c) performing an optimization procedure based on a density evolution (DE) technique or extrinsic information transfer (EXIT) chart curve fitting technique (in step 1330).

BCET systems and methods utilizing frequency domain processing for multicarrier (or multidimensional) signals will now be described.

The following embodiments are directed at improving the performance of the BCET systems and methods described above. In some embodiments, the performance of the BCET systems and methods described above is improved in the presence of multipath, frequency selective fading. FIGS. 14, 15, 16A, 16B and 17 illustrate BCET transmitter and receiver block diagrams, respectively, for a system utilizing frequency domain processing of multicarrier signals.

Figure 14:
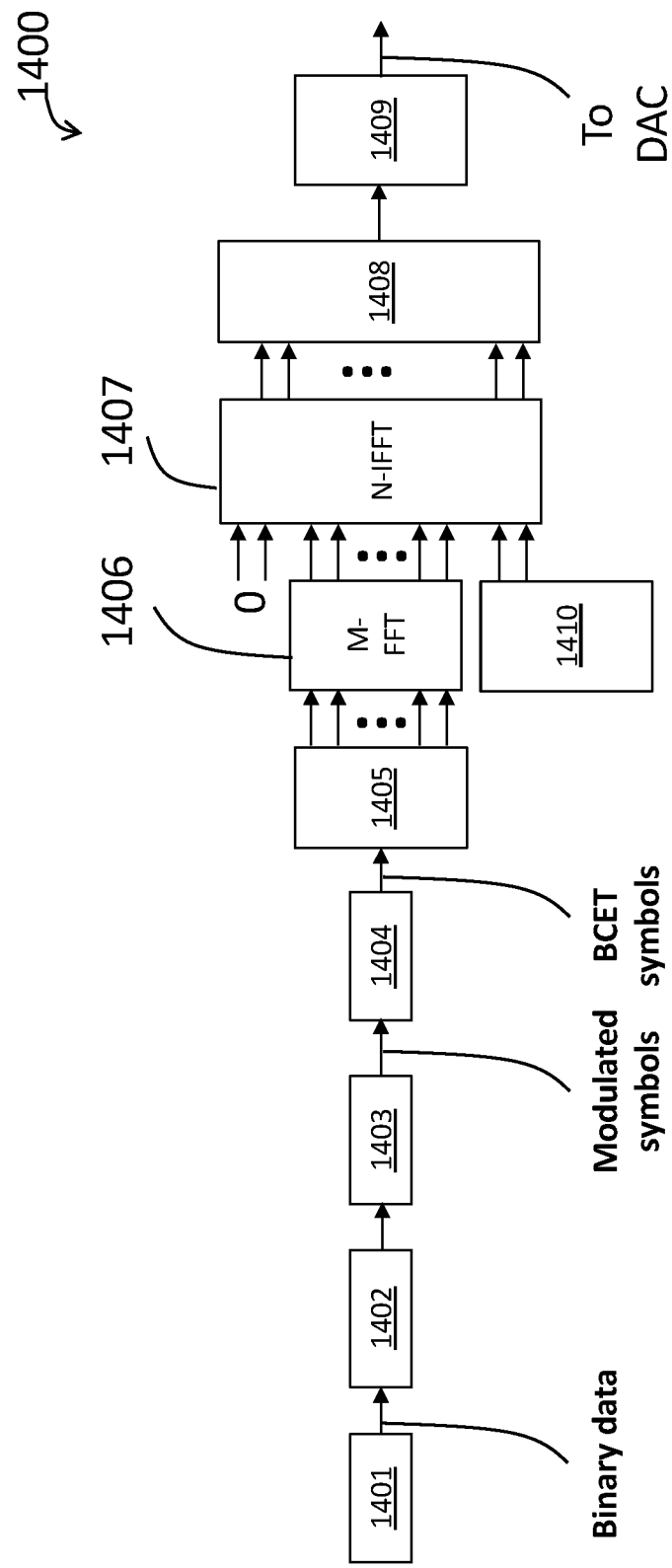
FIG. 14 shows a simplified block diagram of an example of a transmitter for a BCET communication system utilizing multicarrier frequency domain information processing, in accordance with some embodiments.
Figure 15:
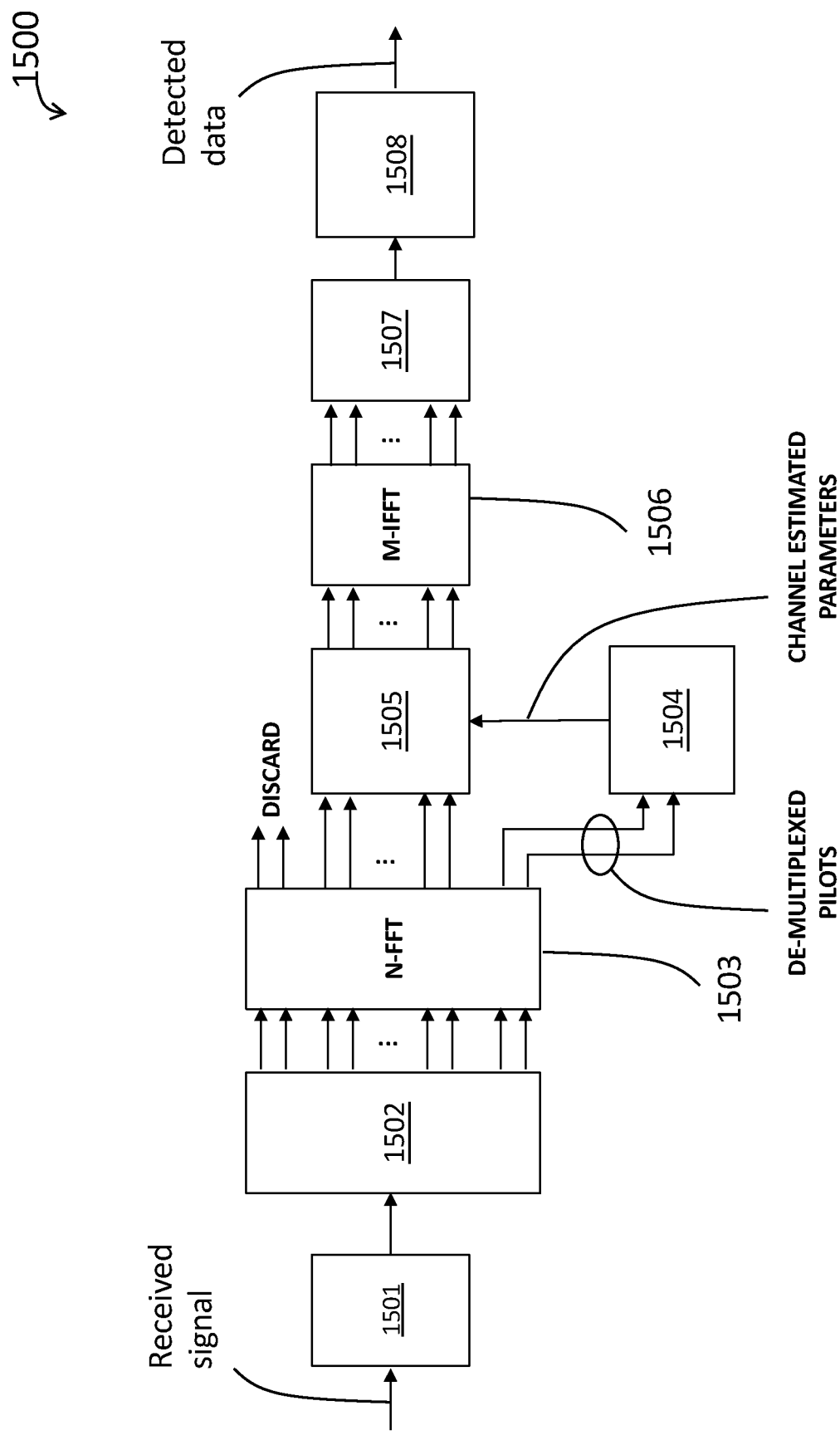
FIG. 15 shows a simplified block diagram of an example of a receiver for a BCET communication system utilizing multicarrier frequency domain information processing, in accordance with some embodiments.

The transmitter 1400 in FIG. 14 is an example of a BCET transmitter 101 shown in FIG. 1, further including components for frequency domain processing of multicarrier signals. Similarly, the receiver 1500 in FIG. 15 is an example of a BCET receiver 102 shown in FIG. 1 and/or a BCET receiver with a turbo equalization loop shown in FIGS. 1 and 4, further including components for frequency domain processing of multicarrier signals. In some embodiments, the components of the transmitter and the receiver depicted in FIG. 1 (and/or FIGS. 1 and 4) are included in a transmitter and a receiver for a BCET system utilizing frequency domain processing of multicarrier signals. However, for simplicity and clarity, some components of the transmitter and the receiver are not shown in FIGS. 14 and 15 respectively. For example, pulse-shaping filter 1404 in FIG. 14 corresponds to the pulse-shaping filter 150 in FIG. 1.

Transmitter 1400 in FIG. 14 utilizes frequency domain processing of multicarrier signals and incorporates the following blocks: a source information input stream 1401, an ECC encoder 1402, a modulation symbol mapper 1403, a BCET pulse-shaping filter 1404, a serial to parallel conversion block 1405, an FFT processing block 1406 with M inputs and outputs (i.e., an M-FFT processing block), a pilot generation block 1410, an inverse FFT (IFFT) processing block 1407 with N inputs and outputs (i.e., an N-IFFT processing block), a parallel to serial conversion block 1408, and a cyclic prefix insertion block 1409.

The source information input stream 1401 sends binary data to the ECC encoder 1402. In some embodiments, the information is encoded with error-control redundant symbols by ECC encoder 1402. ECC encoder 1402 can be an LDPC encoder, or another type of encoder such as those described above. The modulation symbol mapper 1403 produces modulated symbols. Pulse-shaping filter 1404 narrows the bandwidth required for the transmission, by spreading the value of a single modulated symbol to L neighboring symbols, i.e., producing inter-symbol interference (ISI) thus intentionally introducing memory into BCET symbols (or a BCET signal) to be transmitted. Samples of the signal are then serial to parallel converted (e.g., in block 1405) in order to be converted to frequency domain by M-FFT block 1406.

In addition to payload (i.e., the output of block 1406), pilot symbols are also generated (e.g., in block 1410). The traditional method of transmitting pilot symbols in SCM is achieved by means of time multiplexing.

Training blocks of known pseudo random data symbols (also sometimes called unique words) are inserted at regular intervals (e.g., into the frequency domain inputs into the N-IFFT block 1407) among longer blocks of data symbols. In some embodiments, the pilot blocks are at least twice as long as the expected maximum channel impulse response length. The pilot block 1410 can be designed to produce pilot symbols that have a constant envelope and a flat (or approximately flat) spectrum. For example, constant amplitude zero autocorrelation, maximal length PN sequences, or Chu sequences have this property.

In some embodiments of the BCET systems described herein, such as in transmitter 1400 in FIG. 14, pilot tones displace or replace data-carrying tones in the frequency domain. Displacement of data tones by uniformly-spaced pilot tones can be used in OFDM systems. In some cases, the total bandwidth is increased by the number of pilot occupied tones, or for fixed bandwidth the information rate is reduced by the inserted pilots. This technique can be referred to as the frequency expansion technique (FET).

In some cases of the BCET systems described herein, such as in transmitter 1400 in FIG. 14, loss of spectral efficiency due to pilot insertion is avoided if data tones are replaced or scaled and superimposed by regularly-spaced pilots. This type of frequency multiplexed pilot insertion, referred to as frequency domain superimposed pilot technique (FDSPT), has the effect of causing periodic nulls to appear in the spectrum of the transmitted signal (at the frequencies of the inserted pilots).

In some cases of the BCET systems described herein, such as in transmitter 1400 in FIG. 14, powerful nonlinear equalization techniques such as iterative block decision feedback equalization (IBDFE) or turbo equalization can mitigate the resulting received signal distortion, so that systems utilizing a frequency domain superimposed pilot technique can approach within about 1 dB of the performance of systems utilizing pilot tone displacement, while requiring no extra bandwidth or overhead for pilots.

After pilot insertion (or in parallel with pilot insertion), the signal is optionally padded with enough zeros in the frequency domain (e.g., by inserting the "0" signals into block 1407) to make a total length of N in order to oversample the signal with the appropriate oversampling factor. After pilot multiplexing and padding with zeros, the signal is converted back into the time domain by N-IFFT block 1407 (with N>M), and parallel to serial converted in block 1408. Before transmitting the signal to the DAC, a cyclic prefix (CP) is inserted (e.g., in block 1409) to mitigate inter-block interference and to combat distortions caused by a frequency selective multipath transmission channel. In some embodiments, the length of the CP is greater than the multipath channel length.

FIG. 15 illustrates a BCET receiver 1500 block diagram utilizing frequency domain processing of multicarrier signals and incorporates the following blocks: a CP removal block 1501, a serial to parallel conversion block 1502, an N-FFT processing block 1503, a channel estimation (CE) block 1504, a frequency domain equalizer block 1505, an M-IFFT processing block 1506, a parallel to serial conversion block 1507, and a BCET turbo equalization block 1508.

At the receiver side, after signal down conversion, first the CP of the received signal is removed at CP removal block 1501. Samples are serial to parallel converted at block 1502 in order to be applied to the N-FFT block 1503. At the outputs of the N-FFT block 1503, pilots inserted at the transmitter are de-multiplexed and forwarded to CE block 1504. The CE block 1504 sends channel estimated parameters to the frequency domain equalizer block 1505. Data subcarriers are then frequency equalized using a simple one-tap equalization technique based on the channel estimated parameters (e.g., using frequency domain equalization (FDE)) at frequency domain equalizer block 1505. In some cases, frequency domain equalizer block 1505 can be replaced by an NN processing block that performs the functions of the frequency domain equalizer block 1505.

The equalized signal, free from ISI induced by the frequency selective channel, is then fed to M-IFFT block 1506 in order to be converted back to the time domain. In some embodiments, only the inherent intentional ISI from the generation of the bandwidth constrained signal in the BCET system is present in the signal after block 1506. In some embodiments, all of (or the majority of) the unintentionally induced ISI in the signal has been removed from the signal by the time it is output from the block 1506. After block 1506, channel impairments, such as ISI, phase offset, frequency offset, and propagation delay, have been removed or mitigated. After block 1506 the signal is parallel to series converted in block 1507, and the signal (detected data) is then detected and reconstructed by the BCET turbo equalization block 1508 using the systems and methods described above.

Figure 16A:
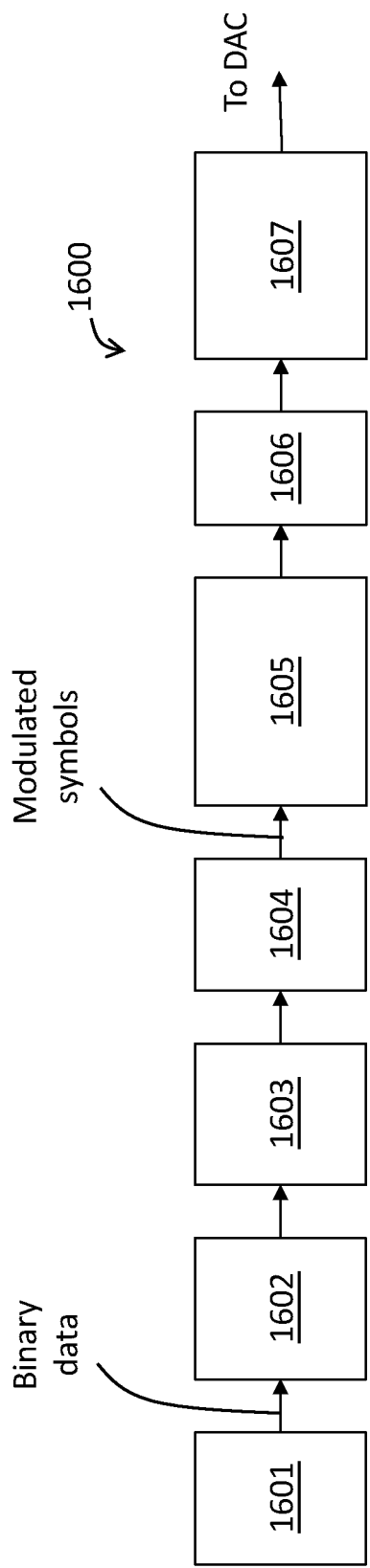
FIGS. 16A and 16B show simplified block diagrams of an example of a transmitter for a BCET communication system utilizing multicarrier frequency domain information processing, in accordance with some embodiments.

The transmitter 1600 in FIG. 16A is an example of a BCET transmitter 101 shown in FIG. 1, further including components for frequency domain processing of multicarrier signals. Similarly, the receiver 1700 in FIG. 17 is an example of a BCET receiver 102 shown in FIG. 1 and/or a BCET receiver with a turbo equalization loop shown in FIGS. 1 and 4, further including components for frequency domain processing of multicarrier signals. In some embodiments, the components of the transmitter and the receiver depicted in FIG. 1 (and/or FIGS. 1 and 4) are included in a transmitter and a receiver for a BCET system utilizing frequency domain processing of multicarrier signals. However, for simplicity and clarity, some components of the transmitter and the receiver are not shown in FIGS. 16A and 16B, and 17, respectively. For example, pulse-shaping filter 1607 in FIG. 16A corresponds to the pulse-shaping filter 150 in FIG. 1.

FIG. 16A is a simplified block diagram of an example of a BCET transmitter 1600 utilizing frequency domain processing. Transmitter 1600 includes an information source 1601, an ECC encoder 1602, an interleaver 1603, a modulation mapper 1604, a pilot insertion block 1605, a cyclic prefix (CP) insertion block 1606, and a BCET pulse-shaping filter 1607. Information bits from information source 1601 are encoded in an ECC encoder 1602, and the encoded bits are then interleaved by an interleaver 1603. The interleaved bits are modulated onto modulated symbols in modulation mapper 1604. Pilots are then added to the modulated symbols in pilot insertion block 1605, either by multiplexing in the frequency domain (FDP) or in the time domain (TDP). In order to combat frequency selective fading, a CP is inserted in CP insertion block 1606. The cyclic prefix (CP) can be inserted in block 1606 to mitigate inter-block interference and to combat distortions caused by a frequency selective multipath transmission channel. In some embodiments, the length of the CP is greater than the multipath channel length. After the CP is inserted, the signal is then BCET filtered using pulse-shaping filter 1607 (i.e., the pulse-shaping filter 1607 intentionally introduces ISI into the signal), and then fed to a DAC and an RF stage of the transmitter.

Figure 16B:
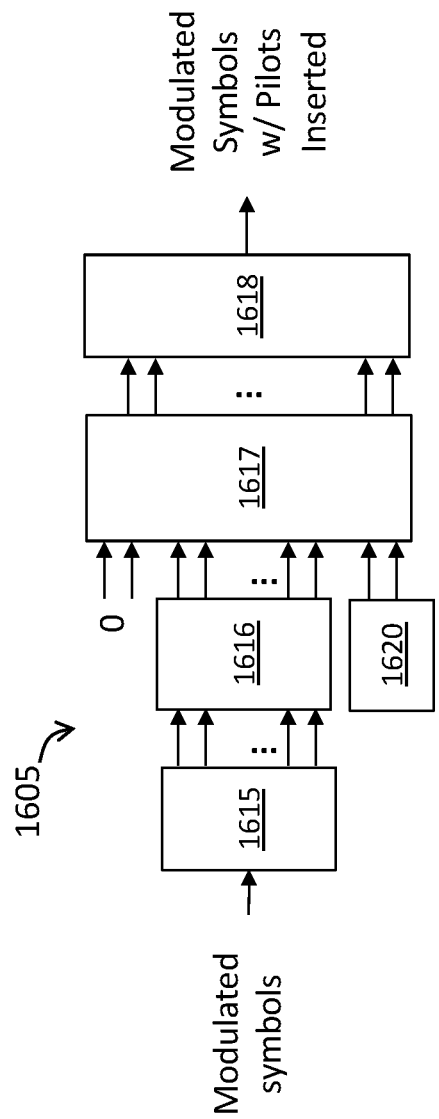
Figure 17:
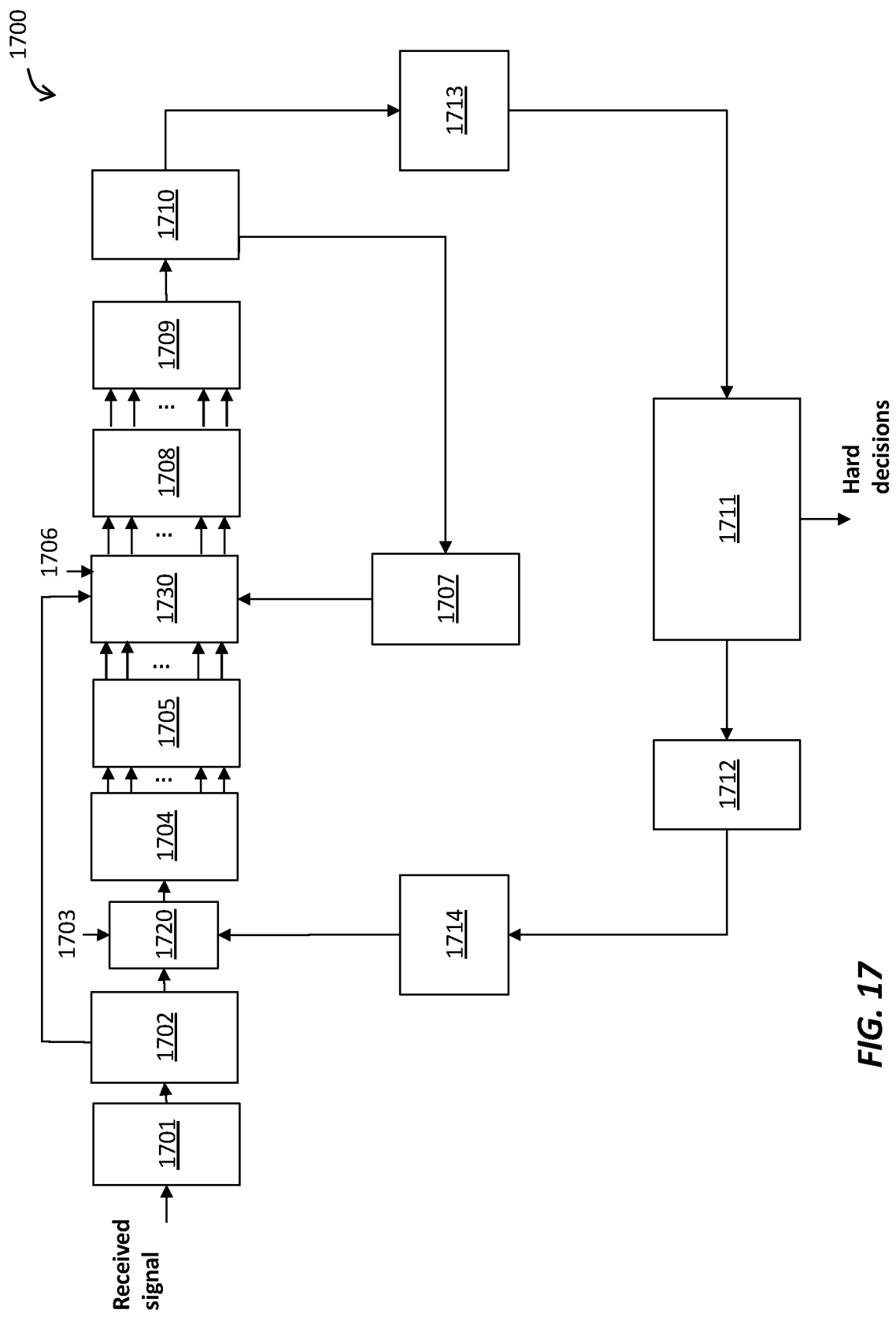
FIG. 17 shows a simplified block diagram of an example of a receiver for a BCET communication system utilizing multicarrier frequency domain information processing, in accordance with some embodiments.

FIG. 16B is a simplified schematic of an example of pilot insertion block 1605. Pilot insertion block 1605 can include a serial to parallel conversion block 1615, an FFT processing block 1616 with M inputs and outputs (i.e., an M-FFT processing block), a pilot generation block 1620, an inverse FFT (IFFT) processing block 1617 with N inputs and outputs (i.e., an N-IFFT processing block), and a parallel to serial conversion block 1618. Modulated symbols of the signal (e.g., from modulation mapper 1604 in FIG. 16A) are serial to parallel converted in block 1615 in order to be converted to the frequency domain by M-FFT block 1616. Pilot symbols are generated in block 1620, and are inserted at regular intervals into the frequency domain inputs into the N-IFFT block 1617 among longer blocks of data symbols.

Pilot symbols, which are training blocks of known pseudo random data symbols (also sometimes called unique words), are inserted at regular intervals into the frequency domain inputs into the N-IFFT block 1617 among longer blocks of data symbols. In some embodiments, the pilot blocks (i.e., bursts of pilot symbols) are at least twice as long as the expected maximum channel impulse response length. The pilot generation block 1620 can be designed to produce pilot symbols that have a constant envelope and a flat (or approximately flat) spectrum. For example, constant amplitude zero autocorrelation, maximal length pseudo-noise (PN) sequences, or Chu sequences have this property.

In some embodiments of the BCET systems described herein, such as in transmitter 1600 in FIGS. 16A and 16B, pilot tones displace or replace data-carrying tones in the signal in the frequency domain. In some cases, the total bandwidth is increased by the number of pilot occupied tones, or for fixed bandwidth the information rate is reduced by the inserted pilots. This technique can be referred to as the frequency expansion technique (FET).

In some cases of the BCET systems described herein, such as in transmitter 1600 in FIGS. 16A and 16B, loss of spectral efficiency due to pilot insertion is avoided if data tones in the signal are replaced or scaled and superimposed by regularly-spaced pilots. This type of frequency multiplexed pilot insertion, referred to as frequency domain superimposed pilot technique (FDSPT), has the effect of causing periodic nulls to appear in the spectrum of the transmitted signal (e.g., at the frequencies of the inserted pilots).

In some cases of the BCET systems described herein, such as in transmitter 1600 in FIGS. 16A and 16B, powerful nonlinear equalization techniques such as iterative block decision feedback equalization (IBDFE) or turbo equalization can mitigate the resulting distortion of a signal received at a receiver, so that systems utilizing a frequency domain superimposed pilot technique can approach within about 1 dB of the performance of systems utilizing pilot tone displacement, while requiring no extra bandwidth or overhead for pilots.

After pilot insertion (or in parallel with pilot insertion), the signal is optionally padded with enough zeros in the frequency domain by inserting the "0" signals into block 1617 to make a total length of N in order to oversample the signal with an appropriate oversampling factor. After pilot multiplexing and padding with zeros, the signal is converted back into the time domain by N-IFFT block 1617 (with N>M), and parallel to serial converted in block 1618. After inserting the pilot symbols, and before transmitting the signal to the DAC, a cyclic prefix (CP) is inserted (in block 1606 in FIG. 16A) and the BCET pulse-shaping filter BCET filters the signal (in block 1607 in FIG. 16A).

FIG. 17 is a simplified block diagram of a BCET receiver 1700 utilizing frequency domain processing. Receiver 1700 incorporates CP removal block 1701, a pilot assisted channel estimation block 1702, soft symbols 1703 fed into a soft-interference cancellation (SIC) principle block 1720, a serial to parallel conversion block 1704, an N-FFT processing block 1705, a frequency domain equalizer (FDE) block (i.e., and information-retrieving equalizer block) 1730, a noise whitening input 1706, an M-IFFT processing block 1708, a parallel to serial conversion block 1709, a symbol to bit mapper 1710, a deinterleaver 1713, an ECC decoder 1711 that outputs hard decisions, a bit to symbol mapper 1712, an interleaver 1714, and an iterative soft value based channel estimation block 1707. In some cases, the soft symbols 1703 can be derived from the pilot symbols received at the receiver 1700.

The N-FFT processing block 1705 can have the same number (N) of inputs and outputs as the N-IFFT block 1617 in the transmitter (i.e., in 1605 in FIG. 16B), and the M-IFFT processing block 1708 can have the same number (M) of inputs and outputs as the M-FFT block 1716 in the transmitter (i.e., in 1605 in FIG. 16B). At the input of the N-FFT processing block 1705, the signal can contain information, pilot tones and zero signals. Between the N-FFT processing block 1705 and the M-IFFT processing block 1708, the pilot tones and zeros, which were inserted into the signal in the transmitter (e.g., in 1605 in FIG. 16B), can be removed such that the M-IFFT processing block 1708 only has M inputs and M outputs for the information channels (without the additional inputs and outputs for the pilot tones and zeros).

The noise whitening input 1706 can assist with whitening (i.e., decorrelating) noise across different frequencies.

The hard decisions output from the ECC decoder 1711 are the final output of the regenerated (decoded) signal from the receiver 1700. In some cases, the decoding at ECC decoder 1711 can fail (e.g., the decoded signal can fail to meet certain predetermined metrics) and instead of the ECC decoder 1711 outputting hard decisions, the ECC decoder 1711 will send updated information back through a loop in the receiver 1700 (containing the SIC block 1720, the FDE block 1730, and the ECC decoder 1711) in order to improve the hard decisions output from ECC decoder 1711. In some cases, after a certain number of maximum iterations (e.g., from 3 to 20) through the loop containing the SIC block 1720, the FDE block 1730, and the ECC decoder 1711, the ECC decoder 1711 will output the hard decisions.

FIG. 17 illustrates a receiver 1700 for a BCET system with iterative soft value based channel estimation and an FDE iterative approach, as described herein. After signal down conversion at the receiver 1700, first the CP is removed in CP removal block 1701. Based on the frequency or time multiplexed pilots inserted in the transmitter (e.g., in block 1617 in FIG. 16B), initial channel estimation (CE) is performed in the pilot assisted channel estimation block 1702. Channel estimation in block 1702 can be carried out in the frequency domain using low complexity FFT techniques with MMSE filtering, where initial channel state information (CSI) estimates are obtained. Next, data detection (DD) of the BCET data block is carried out, according to iterative frequency-domain FDE. The accuracy of the initial CE from block 1702 may not be sufficiently high, due to the minimum size of the pilot sequence and/or a low-SNR environment. In order to improve the CE performance, iterative joint CE and DD is carried out by the receiver 1700.

The received signal is processed by a soft-decision FDE-based MMSE BCET detector that considers colored noise effects, where soft symbols 1703 are generated from a priori information that can be fed into the channel decoder based on the soft-interference cancellation (SIC) principle in block 1720. The soft-decision MMSE detection sub-system in receiver 1700 includes serial to parallel conversion block 1704, N-FFT block 1705 that transforms the signal to the frequency domain, actual FDE MMSE soft decision equalizer 1730 with noise whitening input 1706, iterative channel estimation block 1707 that improves initial channel estimation based on an iterative principle using detected soft symbol estimates, M-IFFT block 1708, and parallel to serial block 1709.

Time domain extrinsic bit LLR values are generated with symbol to bit mapper 1710, de-interleaved in block 1713, and fed to ECC decoder 1711. ECC decoder 1711 generates extrinsic bit LLRs which are used as a priori information and transformed to soft symbols by bit to symbol mapper 1712, interleaved in block 1714, and then fed to SIC block 1720 and carried over to the next ECC decoder iteration.

The iterative ECC decoding loop in receiver 1700 includes blocks, 1720, 1704, 1705, 1730, 1708, 1709, 1710, 1713, 1711, 1712, and 1714. In some cases, the iterative ECC decoding loop comprises at least 3 iterations, from 3 to 15 iterations, from 3 to 20 iterations, or more than 20 iterations. The iterative soft value based channel estimation loop in receiver 1700 includes blocks 1730, 1708, 1709, 1710 and 1707. The receiver 1700 can be referred to as using an "extended turbo loop," because it includes an iterative soft value based channel estimation loop within an iterative ECC decoding loop.

In each ECC decoding iteration in receiver 1700, the detected data block of soft symbols (from symbol to bit mapper 1710 before the symbols are converted to bits) is considered to be a long known sequence, and so it is used to update the estimated channel parameters in the iterative soft value based channel estimation block 1707. The data symbols can then be iteratively detected in the FDE equalizer 1730 using the iteratively updated channel estimates. In some cases, the soft symbols from the iterative soft value based channel estimation are used to update the estimated channel parameters in FDE equalizer block 1730 many times for every ECC decoder iteration. Subsequently, the channel (i.e., channel parameters) is re-estimated in SIC block 1720 exploiting the re-detected symbols (i.e., from the ECC decoder 1711, processed through bit to symbol mapper 1712 and interleaver 1714). By performing the above-mentioned iterative CE and DD, the accuracy of the estimated channels and the data symbols can be improved by increasing the number of iterations in the iterative ECC decoding loop and/or the iterative soft value based channel estimation loop in receiver 1700.

FDE equalization block 1730 in receiver 1700 can mitigate both the intentionally introduced ISI (i.e., from BCET pulse-shaping filter 1607 in FIG. 16A) and unintentional noise on a signal (e.g., ISI that occurs during transmission over a channel, such as channel 160 in FIG. 1). FDE equalization block 1730 can use any of the equalization techniques described above (e.g., with respect to equalizer 1174 in FIG. 1, and/or BCJR equalizer 230 in FIG. 4). In some cases, BCJR is not needed in FDE equalization block 1730 to achieve high performance (e.g., exceed the Shannon limit, or exceed the performance of a non-BCET communications system (i.e., a communication system that does not use narrowband filtering in the transmitter to intentionally introduce memory into a signal, and does not use equalization techniques in the receiver to account for the intentionally introduced memory)). In some examples, BCJR algorithms can be used in conjunction with frequency domain processing in FDE equalization block 1730. In some cases, FDE equalization block 1730 can contain parallel partitioned BCJR equalizers, in conjunction with other equalizers that operate in the frequency domain.

In some embodiments, equalization can be done in the time domain in the receiver 1700. In such cases, serial to parallel conversion block 1704, N-FFT processing block 1705, FDE equalizer 1730, M-IFFT processing block 1708 and parallel to serial conversion block 1709 can all be replaced with a BCJR equalizer (or a set of parallel BCJR equalizers). In such cases, the pilot signals can still be added in the frequency domain in the transmitter (e.g., as shown in FIGS. 16A and 16B) and an iterative ECC decoding loop can still be used together with the iterative soft value based channel estimation loop in receiver 1700, as described herein. In some cases, a portion of the receiver 1700 can operate in the frequency domain and some portions can operate in the time domain. For example, pilot signals can be added in the frequency domain in the transmitter (e.g., 1600 in FIG. 16B), some processing can occur in frequency domain in the receiver (e.g., 1700 in FIG. 17), and the signal can be converted into the time domain for equalization in the receiver (e.g., 1700 in FIG. 17).

ECC decoder 1711 in receiver 1700 can also use any of the decoding techniques described above (e.g., with respect to the ECC decoder in block 1176 in FIG. 1, and/or in the ECC decoder 270 in FIG. 4). For example, the information can be encoded with error-control redundant symbols using an ECC encoder (e.g., in ECC encoder in 1602 in FIG. 16A) with a low-density parity-check (LDPC) code, a turbo code, a polar code, or other type of error control code, and can be decoded using the ECC decoder 1711 in receiver 1700. The LDPC code optimization techniques described herein can also be used to optimize the LDPC code using an ECC encoder (e.g., in ECC encoder in 1602 in FIG. 16A) and the ECC decoder 1711.

In some cases, receiver 1700 contains a receiving filter (not shown). The receiving filter can be matched to the BCET pulse-shaping filter in the transmitter (e.g., 1607 in FIG. 16A), or the receiving filter can be unmatched (e.g., not complimentary) to the BCET pulse-shaping filter in the transmitter. In some cases, a matched receiver filter can be a narrow-band filter that is complementary to the pulse-shaping filter in the transmitter (e.g., 1607 in FIG. 16A). For example, the function used in the matched filter in the receiver can be a conjugated time-reversed version of the function used in the pulse-shaping filter in the transmitter, implemented in the frequency domain.

In some embodiments, one or more components of the ECC decoding loop in receiver 1700 (including blocks, 1720, 1704, 1705, 1730, 1708, 1709, 1710, 1713, 1711, 1712, and 1714) can be replaced by one or more NN processing blocks that operate on the data in the time and/or frequency domain. For example, frequency domain equalizer (FDE) block 1730 can be replaced by a NN processing block that performs the functions of FDE equalizer block 1730. For example, ECC decoder 1711 can be replaced by a NN processing block that performs the functions of ECC decoder 1711, or the entire turbo-loop (e.g., in the system shown in FIG. 18).

BCET systems and methods utilizing neural network systems and methods (or other machine learning or deep learning systems and methods) processing will now be described.

Figure 18:
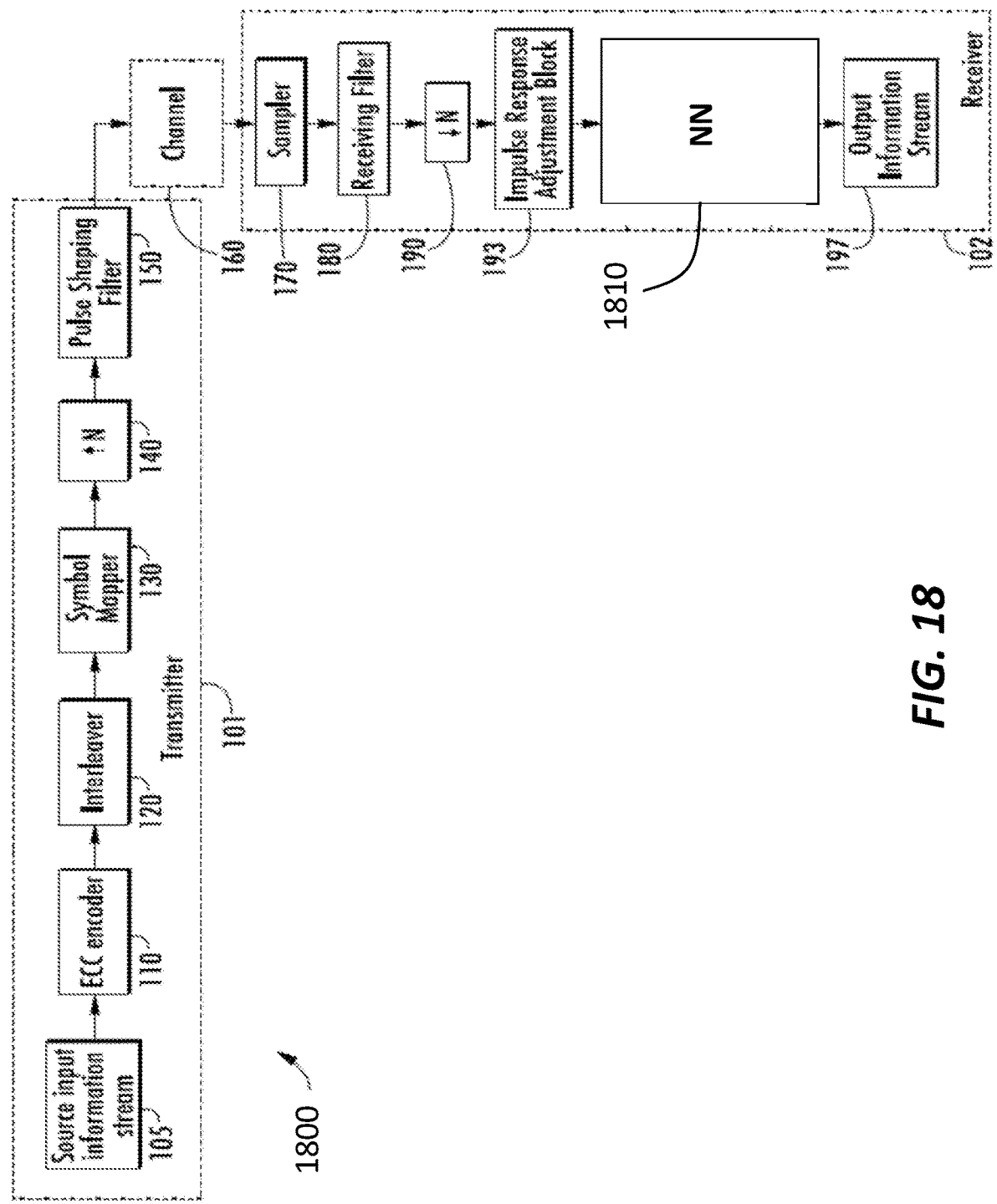
FIG. 18 shows a block diagram of an example of a bandwidth constrained equalized transport (BCET) communication system with a neural network (NN) detection processing block, in accordance with some embodiments.

FIG. 18 shows a block diagram of an example of a bandwidth constrained equalized transport (BCET) communication system with a neural network (NN) detection processing block, in accordance with some embodiments. The diagram in FIG. 18 is similar to the BCET system 100 in FIG. 1 and like elements are similar or the same. The processing blocks 194 (the equalizer), 195 (the de-mapper), 196 (the deinteliver/ECC decoder) in system 100 in FIG. 1 have been replaced by a single NN processing block 1810 in system 1800. Alternatively, more than one (e.g., 2, or 3, or more) NN processing blocks could replace one or more of blocks 194, 195 and 196 in system 100 in FIG. 1. For example, each of blocks 194, 195, and 196 can each be replaced by a single NN processing block. Additionally, in some cases, processing block 193 (the impulse response adjustment block) could be replaced by an NN processing block. For example, processing block 193 could be replaced by a single NN processing block. In another example, processing blocks 193, 194, 195, and 196 in system 100 in FIG. 1 can be replaced by a single NN processing block that performs the functions of all four blocks. In some embodiments, NN processing block 1810 performs the functions of one or more of an equalizer, a BCJR equalizer, a de-mapper, an error-control code decoder, an LDPC decoder, an interleaver, a deinterleaver, a turbo equalization loop, a non-linear function block, a coding block, an iterative information processing block, and an impulse response adjustment block.

Additionally, one or more NN processing blocks can replace one or more of the processing blocks of a turbo-equalization loop. For example, the processing blocks 230 (the BCJR equalizer), 240 (the soft demodulation block), 270 (the ECC decoder) as well as blocks 250 (the deinteleaver), 280 (the inteleaver) and 260 (the nonlinear function) in FIG. 4 can all be replaced by one or more NN processing blocks. For example, a single NN processing block can be used to replace block 230 (the BCJR equalizer), another NN processing block can be used to replace block 240 (the soft demodulation block), and a third NN processing block can be used to replace blocks 270 (the ECC decoder), 250 (the deinteleaver), 280 (the inteleaver) and 260 (the nonlinear function). In another example, all of blocks 230, 240, 250, 260 and 270 can be replaced by a single NN processing block. In some cases, all of these blocks/sub-systems in FIG. 4 (other than the input buffer block 210), can be replaced by a single NN. In some embodiments, one or more NN processing blocks perform the functions of one or more of an equalizer, a BCJR equalizer, a de-mapper, an error-control code decoder, an LDPC decoder, an interleaver, a deinterleaver, a turbo equalization loop, a non-linear function block, a coding block, an iterative information processing block, and an impulse response adjustment block.

Figure 19:
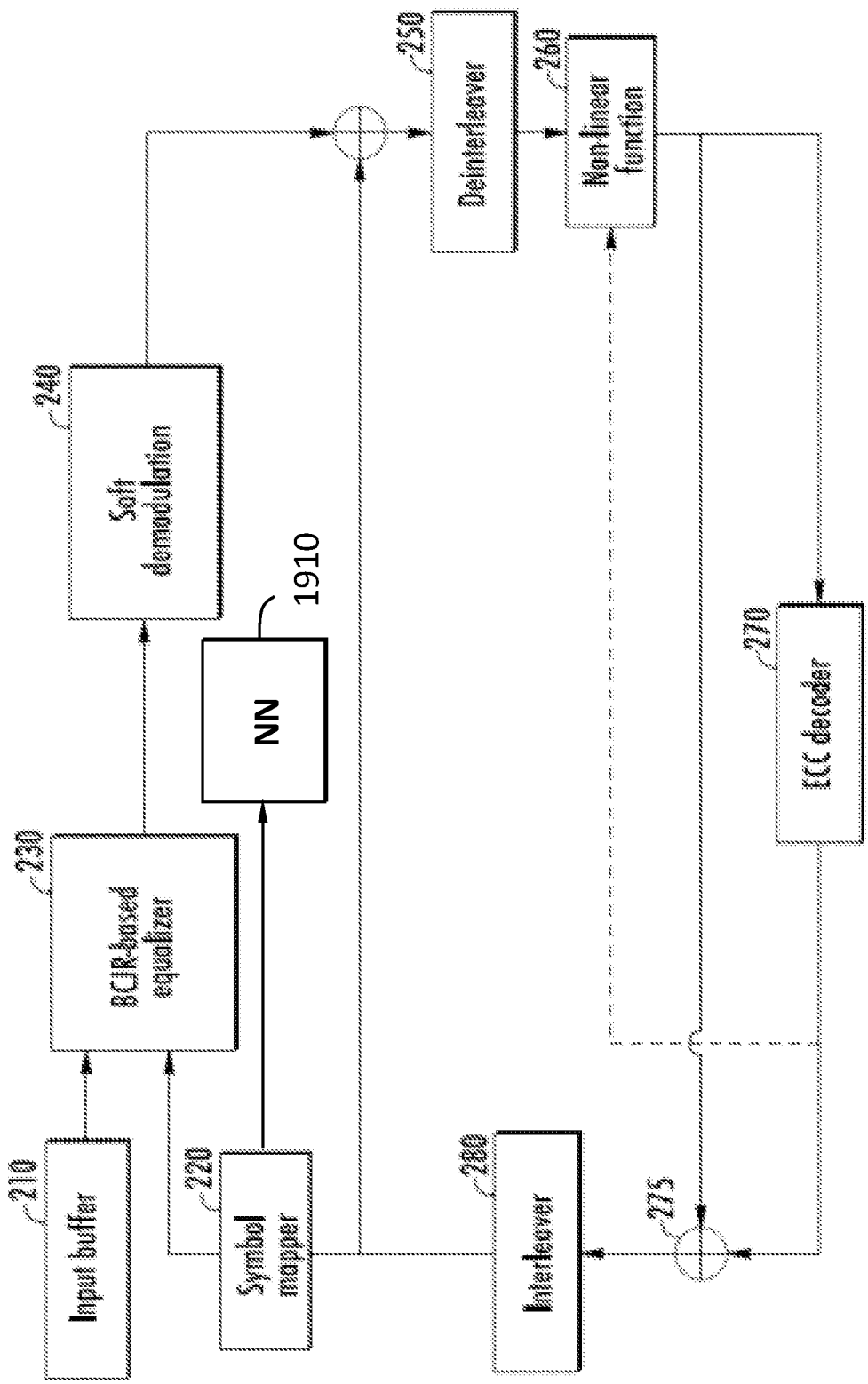
FIG. 19 shows a block diagram of a turbo equalization loop in a BCET system with an NN detection processing block, in accordance with some embodiments.

FIG. 19 shows a block diagram of an example of a turbo equalization loop in a BCET system with an NN detection processing block, in accordance with some embodiments. The diagram in FIG. 19 is similar to the turbo-loop system shown in FIG. 4 and like elements are similar or the same.

FIG. 19 shows an example where an NN processing block 1910 has been added to an output of a turbo-loop (similar to that shown in FIG. 4). In this case, one or more iterations can be performed by the turbo-loop through processing blocks 230, 240, 250, 260, 270, 280 and 220. After one or more iterations through the turbo-loop, the output from the symbol mapper 220 can be sent to NN processing block 1910 to complete the information retrieval in the BCET detector. The decoded signal (containing a set of symbols) can then be output from the NN processing block 1910. In some cases, the addition of the NN processing block 1910 reduces the number of iterations through the turbo-loop required to achieve the same performance compared to a BCET system without NN processing block 1910. In other cases, the input to the NN processing block 1910 can be coupled to an output of a different processing block of the turbo equalization loop, such as to an output of the ECC decoder 270.

Figure 20:
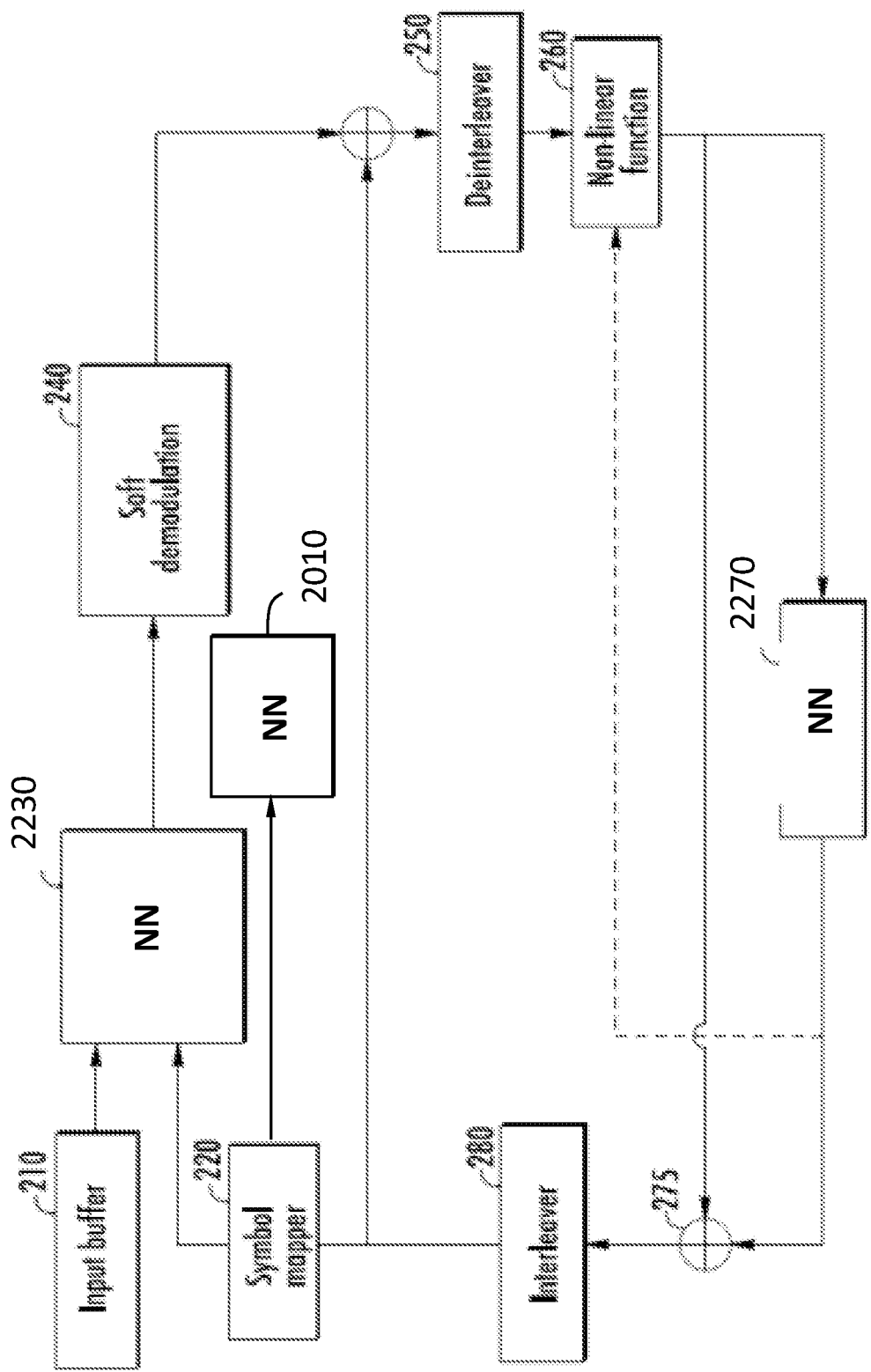
FIG. 20 shows a block diagram of a turbo equalization loop in a BCET system with from one to three NN processing blocks, in accordance with some embodiments.

FIG. 20 shows an example of a turbo-loop of a BCET receiver (e.g., similar to that shown in FIG. 4), where from one to three NN processing blocks are used. In some examples of the system shown in FIG. 20, NN processing block 2230 replaces and performs the functions of an equalizer (e.g., equalizer 230 in FIG. 4, for example a BCJR equalizer). In some examples of the system shown in FIG. 20, NN processing block 2270 replaces and performs the functions of a ECC decoder (e.g., ECC decoder 270 in FIG. 4, for example an LDPC decoder). In some examples of the system shown in FIG. 20, NN processing block 2010 has been added to an output of the turbo-loop as described with respect to FIG. 19. In some embodiments, NN processing blocks 2230, 2270 and 2010 are all included in a turbo-loop of a BCET system as shown in FIG. 20. In some embodiments, one or two of NN processing blocks 2230, 2270 and 2010 are included in a turbo-loop of a BCET system as shown in FIG. 20. In some embodiments, only NN processing block 2230 replaces and performs the functions of the equalizer, and NN processing blocks 2270 and 2010 are omitted from the turbo-loop of a BCET system as shown in FIG. 20. In some embodiments, only NN processing block 2270 replaces and performs the functions of the ECC decoder, and NN processing blocks 2230 and 2010 are omitted from the turbo-loop of a BCET system as shown in FIG. 20. In some embodiments, NN processing block 2230 replaces and performs the functions of the equalizer and NN processing block 2270 replaces and performs the functions of the ECC decoder, and NN processing block 2010 is omitted from the turbo-loop of a BCET system as shown in FIG. 20. In some embodiments, NN processing block 2230 replaces and performs the functions of the equalizer and/or NN processing block 2270 replaces and performs the functions of the ECC decoder, and NN processing block 2010 is added to an output of the turbo-loop of a BCET system as shown in FIG. 20.

In some embodiments, an NN processing block (e.g., 2230 in FIG. 20) replaces and performs the function of an equalizer (e.g., a BCJR equalizer) and the NN processing block comprises one or more feature extraction layers. For example, the function(s) used by a pulse-shaping filter in the transmitter of a BCET system can be communicated to the feature extraction layer(s) of an NN in the receiver, which can aid the NN in its operation. In some cases, the feature extraction layer(s) can be one or more convolutional feature extraction layers. In some cases, the feature extraction layers (or feature extraction network) comprises multiple convolutional and pooling layer pairs. The convolutional layer(s) can contain a collection of digital filters to perform the convolution operation on chunks of input data (similar to matched filters, matched to features of the signal). The pooling layer(s) can be used as dimensionality reduction layer(s) to decide the threshold, and pass on data to additional succeeding NN nodes, layers, or parts.

In some embodiments, the BCET systems with NN processing blocks can use multiple input multiple output (MIMO) principles. For example, in some embodiments of the present BCET systems, a MIMO method can multiply the capacity of a radio transmission link using multiple transmit and receive antennas to reduce noise (e.g., by exploiting multipath propagation). In some cases, an NN processing block (e.g., 2230 in FIG. 20) performs the function of a MIMO equalizer in the receiver. Furthermore, in some cases each of the multiple outputs in the underlying MIMO configuration can each use a separate distinct NN for BCET detection and information retrieval, rather than using a standard MIMO equalizer to process the MIMO architecture overlaid over the plurality of BCET systems. Further still, MIMO detection can be made a part of the iterative detection process, wherein the information is exchanged iteratively between the BCET detection based on the NN's and the MIMO equalizer, whereas the quality of estimation of the received symbols, and, thus, the performance, in the MIMO system is improved over many such iterations.

The NNs described herein can be trained using mappings that are specifically designed to BCET systems. In some cases, the training data can be collected using components of a BCET system. In some cases, the training data can be produced by introducing noise into training signals, where the noise is selected based on the types of noise that a signal may experience in a transmission channel of a communication system (e.g., white Gaussian noise, colored noise, and/or phase noise). In some cases, combinations of two or more different types of noise can be added to a training signal to be used to train the NNs described herein.

In some cases, the NNs described herein can be trained with positive mappings between training signals output from a transmission channel and decoded training signals. The training signals can be transmitted using a BCET transmitter such as the transmitter 101 shown in FIG. 1, over a transmission channel (e.g., 140 in FIGS. 1 and 18). In some cases, the training signals can be output from a transmission channel that introduces unintentional noise onto a training signal. The decoded signals used in the positive mappings can be signals produced from the training data using a receiver of a BCET system that does not utilize an NN, such as receiver 102 in FIG. 1 (optionally including the turbo equalization loop components shown in FIG. 4). In some cases, the decoded signals used in the positive mappings can be the known input training signal (containing a set of training symbols) before being processed by a transmitter or receiver of a BCET system. In some cases, the NN can be trained with negative mappings between the training signals output from the transmission channel and a null space of the LDPC generation matrix. In some cases, the NN can be trained with negative mappings between the training signals output from the transmission channel and erroneous decoded signals that are known to contain errors. In some cases, the errors in the erroneous decoded signals can be the same as or similar to errors that frequently occur in BCET systems that do not utilize NNs, such as those shown in FIGS. 1 and 4.

In some embodiments, a communication system described above, when optimized using the methods described above, can produce a large number of operating points when performing close to or above traditional Shannon capacity bounds.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A method comprising:
   providing an input signal comprising symbols;
   encoding the symbols using an error control code encoder in a transmitter of a communication system to produce encoded symbols, wherein the error control code encoder appends redundant information onto the symbols;
   interleaving the encoded symbols using a first interleaver in the transmitter to produce interleaved symbols;
   intentionally introducing memory into the interleaved symbols in the form of inter-symbol interference using a pulse-shaping filter in the transmitter to produce pulse-shaped symbols;
   transmitting the pulse-shaped symbols to a receiver of the communication system over a physical channel with noise;
   receiving the transmitted pulse-shaped symbols using a receiving filter in the receiver to produce a received filtered signal; and
   processing the received filtered signal using a neural network to detect and retrieve the encoded symbols;
   wherein the neural network is trained with positive mappings between training signals output from a training transmission channel of a training communication system and decoded training signals as well as negative mappings between the training signals output from the training transmission channel and erroneous decoded signals that are known to contain errors.

2. The method of claim 1, wherein the physical channel with noise comprises a physical memoryless channel with additive white Gaussian noise.

3. The method of claim 1, wherein the receiving filter is matched to the pulse-shaping filter.

4. The method of claim 1, wherein the decoded training signals are produced using a method comprising:
   receiving transmitted pulse-shaped training symbols using a training receiving filter in a training receiver of the training communication system to produce a training receiving filtered signal, wherein the received pulse-shaped training symbols were transmitted over the physical channel with noise;
   equalizing the training receiving filtered signal using a training information-retrieving equalizer in the training receiver to produce equalized training symbols, wherein the training information-retrieving equalizer is a trellis-based equalizer;
   deinterleaving the equalized training symbols using a training deinterleaver in the training receiver to produce deinterleaved training symbols;
   processing the deinterleaved training symbols using a non-linear function block in the training receiver to produce a non-linear training signal, wherein the non-linear function block transforms the deinterleaved training symbols according to a non-linear function;
   decoding the non-linear training signal using a training error control code decoder in the training receiver to produce decoded training symbols; and
   iteratively updating the decoded training symbols using a turbo equalization loop in the training receiver to produce updated decoded training symbols after each iteration.

5. The method of claim 4, wherein the turbo equalization loop in the training receiver comprises iteratively repeating:
   equalizing iterated interleaved training symbols using the training information-retrieving equalizer to produce iterated equalized training symbol likelihoods;
   deinterleaving the iterated equalized training symbol likelihoods using a deinterleaver in the turbo equalization loop to produce iterated deinterleaved training symbol likelihoods;
   transforming the iterated deinterleaved training symbol likelihoods using the non-linear function to produce iterated non-linearly transformed training symbol likelihoods;

decoding the iterated non-linearly transformed training symbol likelihoods to produce updated decoded training symbol likelihoods; and interleaving the updated decoded training symbol likelihoods using a second training interleaver in the turbo equalization loop to produce an iterated interleaved training signal comprising the updated decoded training symbols; wherein:

the training error control code decoder comprises code that is optimized based on the intentionally introduced memory into the interleaved training symbols, a code rate, a signal-to-noise ratio, and an equalizer structure in the training receiver;

the training communication system is bandwidth constrained; and the transmitted training signal output from the training transmission channel comprises an information rate that is higher than for an equivalent system without intentional introduction of the memory at the transmitter.

6. The method of claim 1, wherein the training transmission channel introduces noise into the training signals, and the noise comprises one or more of white Gaussian noise, colored noise, and phase noise.

7. The method of claim 1, wherein the training signals were produced using a method comprising:

providing a training input signal comprising training symbols;

encoding the training symbols using a training error control code encoder in a training transmitter of the training communication system to produce encoded training symbols, wherein the training error control code encoder appends redundant information onto the training symbols;

interleaving the encoded training symbols using a first training interleaver in the training transmitter to produce interleaved training symbols;

intentionally introducing memory into the interleaved training symbols in the form of inter-symbol interference using a training pulse-shaping filter in the training transmitter to produce pulse-shaped training symbols;

transmitting the pulse-shaped training symbols to a training receiver of the training communication system over the training transmission channel, wherein the training transmission channel adds noise to the pulse-shaped training symbols; and receiving the transmitted pulse-shaped training symbols using a training receiving filter in the receiver to produce a received filtered signal.

8. The method of claim 1, wherein the neural network performs functions of one or more of an equalizer, a BCJR equalizer, a de-mapper, an error-control code decoder, an LDPC decoder, an interleaver, a deinterleaver, a turbo equalization loop, a non-linear function block, a coding block, an iterative information processing block, and an impulse response adjustment block.

9. The method of claim 1, wherein the neural network performs functions of an equalizer in the receiver.

10. The method of claim 1, wherein the neural network performs functions of an error control code decoder in the receiver.

11. The method of claim 1, wherein the neural network comprises a recursive NN, a recurrent NN (RNN), a long short-term memory RNN, a gated recurrent unit NN, an Elman NN, and/or a Jordan NN.

12. The method of claim 1, wherein the encoding the symbols using the error control code encoder further comprises the error control code encoder using an error control code that is a Low-Density Parity-Check (LDPC) code, a turbo code, or a polar code.

* * * * *